US008486864B2

(12) United States Patent
Aytug et al.

(10) Patent No.: US 8,486,864 B2
(45) Date of Patent: Jul. 16, 2013

(54) METHOD FOR PRODUCING MICROSTRUCTURED TEMPLATES AND THEIR USE IN PROVIDING PINNING ENHANCEMENTS IN SUPERCONDUCTING FILMS DEPOSITED THEREON

(75) Inventors: Tolga Aytug, Knoxville, TN (US); Mariappan Parans Paranthaman, Knoxville, TN (US); Ozgur Polat, Knoxville, TN (US)

(73) Assignees: UT-Battelle, LLC, Oak Ridge, TN (US); University of Tennessee Research Foundation, Knoxville, TN (US)

( * ) Notice: Subject to any disclaimer, the term of this patent is extended or adjusted under 35 U.S.C. 154(b) by 731 days.

(21) Appl. No.: 12/648,748

(22) Filed: Dec. 29, 2009

(65) Prior Publication Data
US 2011/0160066 A1 Jun. 30, 2011

(51) Int. Cl.
*H01L 39/24* (2006.01)
*C23C 14/34* (2006.01)

(52) U.S. Cl.
USPC ........... 505/473; 505/434; 505/237; 505/701; 505/818; 505/819; 427/62; 427/126.3; 427/215; 427/248.1; 204/192.24; 204/192.15; 428/702; 428/323

(58) Field of Classification Search
USPC .................. 505/237, 238, 434, 470–477, 704, 505/780; 428/701, 702, 930; 427/62, 123, 427/126.3, 250, 255.11, 255.19, 255.23, 427/255.28, 255.29, 255.5
See application file for complete search history.

(56) References Cited

U.S. PATENT DOCUMENTS

| 5,739,086 | A | 4/1998 | Goyal et al. |
| 5,741,377 | A | 4/1998 | Goyal et al. |
| 5,898,020 | A | 4/1999 | Goyal et al. |
| 5,944,966 | A | 8/1999 | Suetsugu et al. |
| 5,958,599 | A | 9/1999 | Goyal et al. |
| 6,150,034 | A | 11/2000 | Paranthaman et al. |
| 6,646,528 | B2 | 11/2003 | Ehrenberg et al. |
| 6,764,770 | B2 | 7/2004 | Paranthaman et al. |
| 7,087,113 | B2 | 8/2006 | Goyal |

(Continued)

FOREIGN PATENT DOCUMENTS
WO 2009/017829 A1 2/2009
WO WO 2009/017829 A1 * 2/2009

OTHER PUBLICATIONS

Goyal, "Engineered Columnar Defects for Coated Conductors" Superconductivity for Electric Systems 2007 Annual Peer Review Aug. 7-9, 2007, Doubletree Hotel Crystal City, Arlington, Virginia; pp. 1-64.*

(Continued)

*Primary Examiner* — Stanley Silverman
*Assistant Examiner* — Kallambella Vijayakumar
(74) *Attorney, Agent, or Firm* — Scully, Scott, Murphy & Presser, P.C.

(57) ABSTRACT

The present invention relates to a method for producing a phase-separated layer useful as a flux pinning substrate for a superconducting film, wherein the method includes subjecting at least a first and a second target material to a sputtering deposition technique in order that a phase-separated layer is deposited epitaxially on a primary substrate containing an ordered surface layer. The invention is also directed to a method for producing a superconducting tape containing pinning defects therein by depositing a superconducting film on a phase-separated layer produced by the method described above.

34 Claims, 13 Drawing Sheets (A)

(B)

(C)

(D)

U.S. PATENT DOCUMENTS

| | | | |
|---|---|---|---|
| 7,229,498 | B2 | 6/2007 | Norman et al. |
| 7,258,928 | B2 | 8/2007 | Paranthaman et al. |
| 7,365,271 | B2 | 4/2008 | Knoll et al. |
| 7,381,318 | B2 | 6/2008 | Yoo et al. |
| 7,754,510 | B2 | 7/2010 | Wu et al. |
| 7,964,440 | B2 | 6/2011 | Salleo et al. |
| 8,221,909 | B2* | 7/2012 | Aytug et al. .................... 428/702 |
| 2005/0127133 | A1 | 6/2005 | Selvamanickam |
| 2006/0131563 | A1 | 6/2006 | Salleo et al. |
| 2006/0276344 | A1 | 12/2006 | Paranthaman et al. |
| 2007/0178227 | A1 | 8/2007 | Hunt et al. |
| 2008/0113870 | A1 | 5/2008 | Lee et al. |
| 2008/0153709 | A1 | 6/2008 | Rupich et al. |
| 2008/0176749 | A1 | 7/2008 | Goyal |
| 2009/0088325 | A1 | 4/2009 | Goyal et al. |
| 2010/0081574 | A1* | 4/2010 | Goyal ........................... 505/474 |

OTHER PUBLICATIONS

Wee et al, "Phase-Separated, Epitaxial, Nanostructured LaMnO3+MgO composite cap layer films for propagation of pinning defects in YBa2Cu3O7-d coated conductors," Apl Phys Express 2 (2009) 063008.*

Xiong et al, "Progress in High Throughput Processing of Long Length, High Quality and Low Cost I Bad MgO Buffer Tape at SuperPower," ASC 2008—Aug. 18-22, 2008; pp. 1-12.*

Cantoni C. et al., "Deposition and Characterization of $YBa_2Cu_3O_{7-\delta}$/$LaMnO_3$/MgO/TiN Heterostructures on Cu Substrates for Development of Coated Conductors", *J. Mater. Res.* 18(10):2387-2400 (2003).

Lebedev O.I. et al., "Structural Phase Transitions and Stress Accommodation in $(La_{0.67}Ca_{0.33}MnO_3)_{1-x}$:$(MgO)_x$ Composite Films", *Physical Review B* 66:104421-1-104421-10 (2002).

Fukaya K. et al., "Analysis of Precursors for Crystal Growth of YBaCuO Thin Films in Magnetron Sputtering Deposition", *Thin Solid Films* 517:2762-2766 (2009).

Polat O. et al., "Direct Growth of $LaMnO_3$ Cap Buffer Layers on Ion-Beam-Assisted Deposition MgO for Simplified Template-Based $YBa_2Cu_3O_{7-\delta}$ Coated Conductors", *J. Mater. Res.* 23(11):3021-3028 (2008).

Kim H.S. et al., "Deposition of $LaMnO_3$ Buffer Layer on IBAD-MgO Template by Reactive DC Sputtering", *Physica C* 469:1554-1558 (2009).

Venkataraman K. et al., "Growth of Lanthanum Manganate Buffer Layers for Coated Conductors Via a Metal-Organic Decomposition Process", *IEEE Transactions on Applied Superconductivity* 15(2):3005-3008 (2005).

Paranthaman M. et al., "Growth of Thick $YBa_2Cu_3O_{7-\delta}$ Films Carrying a Critical Current of Over 230 A/cm on Single $LaMnO_3$-Buffered Ion-Beam Assisted Deposition MgO Substrates", *J. Mater. Res.* 18(9):2055-2059 (2003).

Paranthaman M.P. et al., "Growth of YBCO Films on MgO-Based Rolling-Assisted Biaxially Textured Substrates Templates", *Superconductor Science and Technology* 18:223-228 (2005).

Wasa K. et al., *Handbook of Sputter Deposition Technology, Principles, Technology and Applications*, Noyes Publications, Westwood, NJ, © 1992 (pp. 97-257).

Polat O. et al., Materials Research Society Spring Meeting 2009, Symposium CC: Nanoscale Functionalization and New Discoeries in Modern Superconductivity, Presentation No. CC3.8, San Francisco, Apr. 15, 2009.

Xiong X. et al., "Progress in High Throughput Processing of Long Length, High Quality and Low Cost IBAD MgO Buffer Tape at SuperPower", *Applied Superconductivity Conference 2008*, Chicago, IL, Aug. 18-22, 2008.

Barnes P.N. et al., "Low AC Loss Structures in YBCO Coated Conductors With Filamentary Current Sharing", *IEEE Transactions on Applied Superconductivity* 15(20:2827-28301_2005).

Däumling M. et al., "Ac Loss in Superconducting Power Cables", *Studies of High Temperature Superconductors* vol. 33:pp. 73 (1-39) (2000).

Malezemoff A.P. et al., "AC Losses in BSCCO Wires", *Chinese Journal of Physics* 34(2-10:222-231 (1996).

Gömöry F. at al., "The Influence of Filament Arrangement on Current Distribution and AC Loss in Bi-2223/Ag Tapes", *Superconductor Science and Technology* 17:S150-S154 (2004).

Inada R., "Feature Article: Advancement in Superconducting Material Technology-Advancements in Low AC Loss Technology of Bi-2223 Wire-", *Superconductivity Web21*, Jul. 15, 2008, published by International Superconductivity Technology Center, Tokyo, Japan.

"An Impressive Patent Portfolio", Internet Article 2006, 1-3, ORNL Review vol. 39(3).

Wee, S.H. et al., "Phase-Separated, Epitaxial, Nanostructured $LaMnO_3$+MgO Composite Cap Layer Films for Propagation of Pinning Defects in $YBa_2Cu_3O_7$-a Coated Conductors", *Applied Physics Express*, vol. 2, pp. 063008-1-063008-3, 2009.

Zheng, H. et al., "Multiferroic $BaTiO_3$-$CoFe_2O_4$ Nanostructures", www.sciencemag.org, vol. 303, pp. 661-663, Jan. 30, 2004.

Ko, K.P., et al., "Processing and characterization of $LaMnO_3$-buffered layer on IBAD-MgO template", *Physica C*, vol. 468, pp. 1597-1600, May 25, 2008.

Ko. K.P., et al., "Fabrication of highly textured IBAD-MgO template by continuous reel-to-reel process and its characterization", *Physica C*, vols. 463-465, pp. 564-567, May 24, 2007.

Yamada, Y. et al., "Long IBAD-MgO and PLD coated conductor", *Physica C*, vol. 469, pp. 1298-1302, May 30, 2009.

International Search Report and Written Opinion dated Aug. 19, 2011.

Wee, S.H. et al., "Phase Separated, Epitaxial, Nano structured $LaMnO_3$+MgO Composite Cap Layer Films for Propagation of Pinning Defects in $YBa_2Cu_3O_{7-6}$ Coated Conductors," *Applied Physics Express* 2(2009):063008 (Jap Soc Appl Phys).

Zheng, H. et al, "Multiferroic $BaTiO_3$-$CoFe_2O_4$ Nanostructures," *Science* 303(2004):661-3.

* cited by examiner

METHOD FOR PRODUCING MICROSTRUCTURED TEMPLATES AND THEIR USE IN PROVIDING PINNING ENHANCEMENTS IN SUPERCONDUCTING FILMS DEPOSITED THEREON

This invention was made with government support under Contract Number DE-AC05-00OR22725 between the United States Department of Energy and UT-Battelle, LLC, and under a joint research agreement between the University of Tennessee and UT-Battelle, LLC. The U.S. government has certain rights in this invention.

FIELD OF THE INVENTION

The present invention relates to high temperature superconductor films, tapes, and wires, and more particularly, to such films, tapes, and wires with improved flux-pinning and reduced AC losses.

BACKGROUND OF THE INVENTION

Methods for the preparation of films of high temperature superconductor (HTS) materials on various substrates are well known. These methods have been instrumental for converting HTS materials into tapes and wires, a necessary step in the effort for integrating these materials as wiring into conventional electrical grid systems and devices. Several companies produce HTS wires and tapes of various lengths.

The first HTS tapes suffered from unacceptably low critical current densities, a problem caused by poor alignment of grains in the HTS film or coating with grains of the substrate. Several techniques have therefore been developed to fabricate wires or tapes wherein grain alignment is produced. Of particular note is epitaxial growth of superconductors on such ordered substrates as the Rolling-Assisted-Biaxially-Textured-Substrates (RABiTS). RABiTS substrates typically include a textured metal underlayer (for example, nickel or nickel alloy) and an epitaxial buffer layer (for example, $Y_2O_3$ and/or yttria-stabilized zirconia, YSZ). The development, preparation, and application of RABiTS is disclosed in several references and patents, including, for example, U.S. Pat. Nos. 7,087,113, 5,739,086, 5,741,377, 5,898,020, 5,958,599, and 5,944,966. Epitaxial superconductors on biaxially-textured substrates have significantly improved critical current densities of HTS tapes, and thus, improved suitability for commercial applications.

However, a well-known problem of HTS tapes and wires to which much research has been directed is the dissipation in critical current density (typically expressed as $J_c$) of the superconductor film when the superconductor film is exposed to an external magnetic field. Since external magnetic fields (typically as high as 5 Tesla, or higher) are prevalent in most commercial and industrial applications, there has been a significant effort in incorporating design features into the superconductor film that mitigate these current density losses. One particularly promising method has been to introduce structural defects (i.e., pinning defects) into the superconductor film. The pinning defects have been found to significantly reduce current density losses in superconductor films in the presence of an external magnetic field.

Though physical methods (e.g., by laser scribing or photolithographic patterning) and chemical doping (e.g., with $BaZrO_3$) have been utilized to introduce pinning defects into the superconductor film, recent research has focused on introducing such defects into superconducting films by growing superconducting films epitaxially on substrates possessing microstructural defects (e.g., phase-separated components). However, the common techniques currently capable of producing such phase-separated substrates (e.g., physical vapor deposition (PVD), pulsed laser deposition (PLD), molecular beam epitaxy (MBE), and atomic layer deposition (ALD)), possess the significant drawbacks of being non-scalable, cost prohibitive, and industrially inefficient (i.e., typically of low throughput).

There is a need for a method capable of producing epitaxial layers of phase-separated substrates in a high-throughput manner and within the time and cost constraints that would make the method feasible for use on an industrial scale. The method would preferably be integratable with current HTS tape production methods. By producing improved HTS tapes and wires cost-effectively on a large scale, such a method could hasten the adoption of superconducting wiring in a variety of applications, and make a superconducting wiring infrastructure more realizable and achievable.

SUMMARY OF THE INVENTION

In one aspect, the invention is directed to an efficient method for producing a phase-separated layer useful as a flux pinning substrate for a superconducting film. The method described herein employs a sputtering deposition technique for producing the phase-separated layer. In a preferred embodiment, the method involves subjecting at least a first and a second material (i.e., first and second components of a sputter target material) to a sputtering technique such that a phase-separated layer is deposited epitaxially on a primary substrate containing an ordered surface layer.

In another aspect, the invention is directed to a method for producing a superconducting tape, film, or wire containing pinning defects therein, wherein a superconducting film is deposited on the phase-separated layer prepared by the method described above. The superconducting film is deposited on the phase-separated layer in such a manner that defects (preferably, ordered defects) of the phase-separated layer are transmitted into the superconducting layer, thereby producing a flux-pinned superconducting tape, film, or wire.

The invention advantageously provides an industrially efficient and financially feasible method for incorporating nanoscale defects and/or filamentized features into superconducting films, tapes, and wires. By this method, superconducting tapes with increased flux pinning and reduced AC losses can be made cost-effectively and efficiently on an industrial scale, thereby making superconducting tapes and wires a more realistic option as wiring in commonplace applications. The method also makes possible the ability to modulate the level of AC loss reduction, flux pinning, and other attributes of the superconducting film by appropriate modification of the phase-separated layer by judicious selection or optimization of sputtering and related conditions.

DETAILED DESCRIPTION OF THE INVENTION

Figure 1:
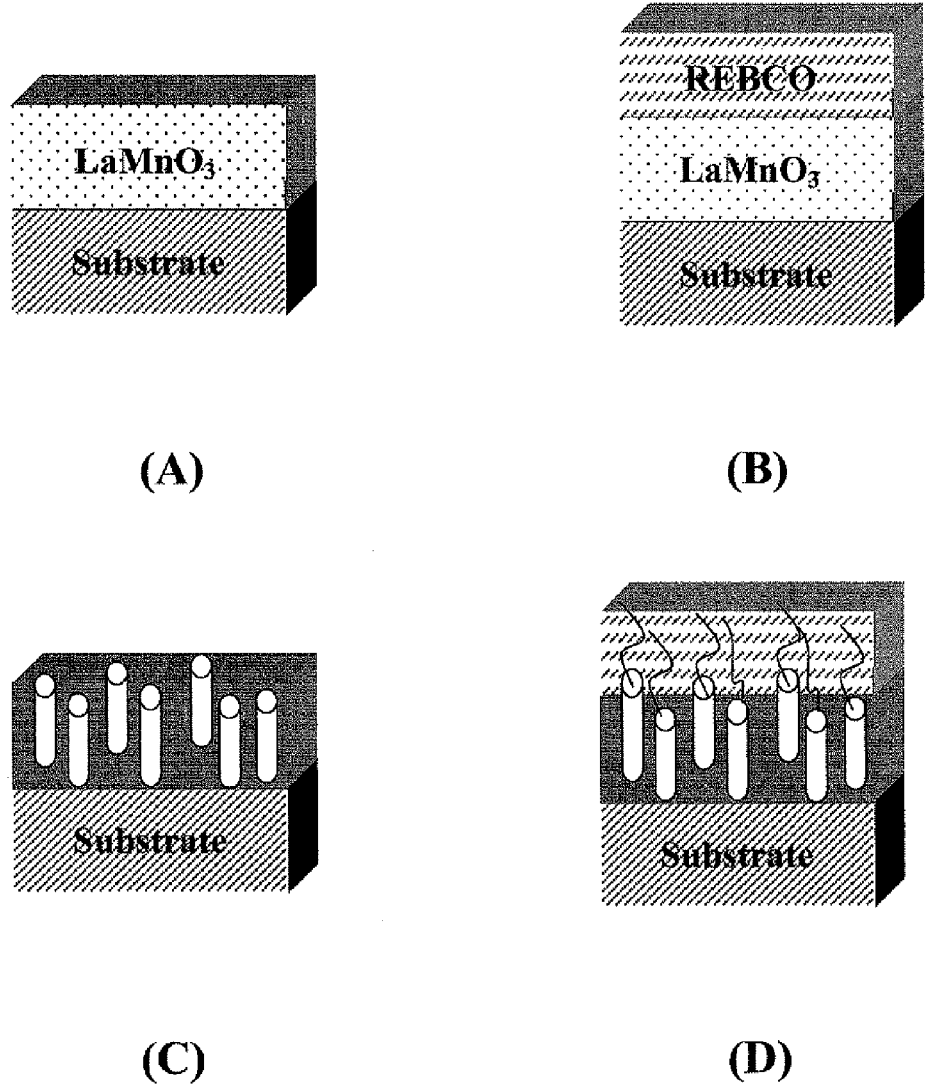
FIGS. 1A-1D. Drawings depicting A) conventional LMO/IBAD-MgO substrate architecture, B) conventional REBCO/LMO/IBAD-MgO architecture, C) an exemplary LMO:MgO/IBAD-MgO structure of the invention, and D) an exemplary REBCO/LMO:MgO/IBAD-MgO structure of the invention.

In one aspect, the invention is directed to an efficient method for producing a phase-separated layer useful as a flux pinning substrate for a superconducting film. The term "flux pinning substrate", as used herein, refers to a substrate, which, by virtue of phase-separated portions therein, can introduce flux pinning defects into a superconducting film that is deposited onto (i.e., grown on) the phase-separated substrate.

The method for producing the phase-separated layer involves subjecting a target material (which contains two or more target components) to a sputtering technique such that a phase-separated layer is deposited epitaxially on a primary substrate containing an ordered surface layer. At least two of the components of the target material should have the characteristic of becoming phase-separated in a resulting deposited layer under the conditions employed in the sputtering technique. The characteristic of becoming phase-separated can be, for example, an inherent characteristic of the components (i.e., a propensity to phase-separate), or alternatively, a result of a reaction or interaction of the components with each other or another agent.

The phase-separated layer is characterized by containing therein regions of different compositions, or more broadly, regions having different lattice structures, i.e., regions that are crystallographically dissimilar or mismatched. Regions of different compositions will necessarily possess different lattice structures. The boundaries between the different regions serve to transmit (i.e., propagate) flux-pinning defects into a superconducting film subsequently deposited on the phase-separated layer. The flux-pinning defects in the superconducting film typically result from crystallographically-mismatched regions introduced into the superconducting film by the phase-separated layer.

Preferably, the crystallographically-mismatched regions in the phase-separated layer have an ordered arrangement with respect to each other. The degree of order possessed by the phase-separated layer is preferably of the degree found in highly ordered self-assembled structures. For example, the order is preferably characterized by fixed or patterned distances (i.e., interspaces) between crystallographically matching (or same-composition) regions, such as would be found in self-assembled (e.g., interdigitated or periodic) ordered materials. When the distances are fixed, the distances between crystallographically matching regions are constant throughout the phase-separated layer. When the distances are patterned, the distances between at least a portion of the crystallographically matching regions are different, but follow a repeating pattern throughout the phase-separated layer.

In one embodiment, the fixed or patterned distances between crystallographically matching regions are on the nanoscale, such as a distance of about or no more than 1 nm, 2 nm, 3 nm, 4 nm, 5 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, or 950 nm, or a distance within a particular range bounded by any two of the foregoing values. In another embodiment, the fixed or patterned distances between crystallographically matching regions are on the microscale, such as a distance of about or no more than 1 μm, 2 μm, 3 μm, 4 μm, 5 μm, 10 μm, 20 μm, 30 μm, 40 μm, 50 μm, 60 μm, 70 μm, 80 μm, 90 μm, 100 μm, 125 μm, 150 μm, 175 μm, 200 μm, 225 μm, or 250 μm, or a distance within a particular range bounded by any two of the foregoing values. In another embodiment, a portion of the fixed or patterned distances is within the nanoscale range while another portion of the fixed or patterned distances is within the microscale range.

The crystallographically mismatched regions in the phase-separated layer can have any particular shape. For example, in different embodiments, at least one of the groups of phase-separated regions are substantially spherical (e.g., globules), or columnar (e.g., filamentous), or plate-like. In the particular case of columnar structures, the columnar structures can be, for example, a cylindrical, square, rectangular, or triangular columnar structure, or a polygonal columnar structure (e.g., pentagonal, hexagonal, or other polygonal columnar shape). Furthermore, a cylindrical columnar shape includes ovoid or flattened cylindrical shapes.

Though any arrangement is considered herein, for the purpose of transmitting pinning defects into the superconducting film, it is necessary that the surface of the phase-separated layer on which the superconductor is to be deposited is a phase-separated surface (i.e., it would not be acceptable for the surface to be of a single phase even though phase-separated regions are present below the surface). In one embodiment, the phase-separated layer is characterized by the presence of columnar or platelike phase-separated regions having their vertical axes (i.e., length-wise or longest axes, as opposed to shorter width-wise axes) oriented non-parallel to the ordered surface of the primary substrate and/or to the surface of the phase-separated layer, wherein the ends of the columnar or platelike phase-separated regions fowl a portion of the surface of the phase-separated layer. Preferably, the vertical axes of the columnar or platelike regions are substantially or precisely perpendicular to the primary substrate and/or the surface of the phase-separated layer (see, for example, FIG. 1C). In another embodiment, the phase-separated layer is characterized by the presence of columnar or platelike phase-separated regions having their vertical axes oriented substantially or precisely parallel to the ordered surface of the primary substrate and/or to the surface of the phase-separated layer. In the foregoing case, the surface of the phase-separated layer on which the superconducting film will be deposited is striated by the lengthwise portions of the columnar or platelike structures.

The target components used in the sputtering technique can be independently selected from any of the known classes of solid-phase (i.e., solid at room temperature, or 25° C.) compounds or materials, e.g., oxides, nitrides, carbides, borides, phosphides, sulfides, silicides, aluminides, stannides, antimonides, selenides, tellurides, niobides, germanides, halides (e.g., fluoride, chloride, bromide, or iodide) of any charge-balancing element, particularly a metallic element, such as an alkali, alkaline earth, transition, lanthanide, or actinide metal. One or more of the target components can also be an elemental form of any element, such as a zerovalent transition metal (e.g., Cu, Ni, or Zn) or main group metal (e.g., B, Al, P, or S). The target material can also include a compound or material containing a complex ion, such as a metal salt of a carbonate, sulfate, nitrate, nitrite, azide, phosphate, or chlorate. The compounds or materials of the target material or phase-separated layer can optionally be doped with one or more types of elements, The compound or materials of the target material described herein also include all of their crystallographic (e.g., cubic vs. hexagonal) and physical forms (e.g., high melting and lower melting forms). In other embodiments, the target material and/or resulting phase-separated layer excludes one or more of any of the classes of compounds or materials described above.

Generally, the target components have melting points of at least 200° C., or at least 250, 300, 350, 400, 450, 500, 550, 600, 650, 700, 750, 800, 850, 900, 950, or 1000° C. However, one or more of the target components can, in certain embodiments, have a melting point up to or less than 200, 150, or 100° C., particularly if these components function as precursor or reactive compounds or materials for producing a higher temperature material in the phase-separated layer during the sputtering process.

In one embodiment, the target material (and/or resulting phase-separated layer) includes at least two compounds or materials of the same class (e.g., two compounds or materials selected from either metal oxides or metal nitrides). In another embodiment, the target material (and/or resulting phase-separated layer) includes at least two compounds or materials within different classes (e.g., a metal oxide and a metal nitride, or a metal oxide and a metal sulfide).

In a particular embodiment, the target material and/or resulting phase-separated layer includes at least one metal chalcogenide (e.g., an oxide, sulfide, selenide, or telluride of a metal) and/or at least one metal pnictide (e.g., a nitride, phosphide, arsenide, or antimonide of a metal). The metal in the metal oxide can be any one or a combination of metals. The metal in the oxide can be, for example, an alkali, alkaline earth, transition, main group, lanthanide, or actinide metal. In other embodiments, the target material and/or resulting phase-separated layer excludes a chalcogenide compound or material, and/or a pnictide compound or material, or any one or more of the particular classes or types of chalcogenide or pnictide materials described above.

In a first embodiment, the target material and/or resulting phase-separated layer includes at least one alkali metal chalcogenide (e.g., oxide, sulfide, selenide, or telluride of a Group IA metal) or at least one alkali metal pnictide (e.g., nitride, phosphide, or arsenide of a Group IA metal). Some examples of alkali metal chalcogenides include lithium oxide ($Li_2O$), sodium oxide ($Na_2O$), potassium oxide ($K_2O$), rubidium oxide ($Rb_2O$), and the corresponding alkali metal sulfides, selenides, and tellurides. Some examples of alkali metal pnictides include lithium nitride ($Li_3N$), lithium phosphide ($Li_3P$), lithium arsenide ($Li_3As$), sodium nitride ($Na_3N$), sodium phosphide ($Na_3P$), and sodium arsenide ($Na_3As$).

In a second embodiment, the target material and/or resulting phase-separated layer includes at least one alkaline earth metal chalcogenide (e.g., oxide, sulfide, selenide, or telluride of a Group IIA metal) or at least one alkaline earth metal pnictide (e.g., nitride, phosphide, or arsenide of a Group IIA metal). Some examples of alkaline earth metal chalcogenides include beryllium oxide (BeO), magnesium oxide (MgO), calcium oxide (CaO), strontium oxide (SrO), barium oxide (BaO), and the corresponding alkaline earth metal sulfides, selenides, and tellurides. Some examples of alkaline earth metal pnictides include beryllium nitride ($Be_3N_2$), magnesium nitride ($Mg_3N_2$), calcium nitride ($Ca_3N_2$), strontium nitride ($Sr_3N_2$), and the corresponding phosphides, arsenides, and antimonides.

In a third embodiment, the target material and/or resulting phase-separated layer includes at least one main group metal chalcogenide (e.g., solid oxide, sulfide, selenide, or telluride of a Group IIIA, IVA, VA, or VIA metal) or at least one main group metal pnictide (e.g., nitride, phosphide, or arsenide of a Group IIIA, IVA, VA, or VIA metal). Some examples of main group metal chalcogenides include the boron oxides (e.g., $B_2O_3$ and its different forms), aluminum oxides (e.g., $Al_2O_3$ and its different forms), gallium oxides (e.g., $Ga_2O_3$), indium oxides (e.g., $In_2O_3$ and indium tin oxide (ITO)), silicon oxides (e.g., $SiO_2$ and its different forms), germanium oxides (e.g., $GeO_2$ and GeO), tin oxides (e.g., $SnO_2$ and SnO), lead oxides (e.g., $PbO_2$ and PbO), phosphorus oxides (e.g., $P_2O_5$), arsenic oxides (e.g., $As_2O_3$), antimony oxides (e.g., $SbO_2$ or $Sb_2O_4$), bismuth oxides (e.g., $Bi_2O_3$ and its different forms), selenium oxides (e.g., $SeO_2$), tellurium oxides (e.g., $TeO_2$), and the corresponding main group metal sulfides, selenides, and tellurides. Some examples of main group metal pnictides include boron nitrides (e.g., BN, and its different crystallographic forms), aluminum nitrides (AlN), gallium nitrides (e.g., GaN), indium nitrides (e.g., InN), and the corresponding main group metal phosphides, arsenides, and antimonides.

In a fourth embodiment, the target material and/or resulting phase-separated layer includes at least one transition metal chalcogenide (e.g., oxide, sulfide, selenide, or telluride of a Group B element) or at least one transition metal pnictide (e.g., nitride, phosphide, or arsenide of a Group B element). The transition metal can be a first row transition metal (i.e., elements of atomic number 21-30), a second row transition metal (i.e., elements of atomic number 39-48), or a third row transition metal (i.e., elements of atomic number 72-80). Some examples of transition metal chalcogenides include the scandium oxides (e.g., $Sc_2O_3$, or scandia), yttrium oxides (e.g., yttria or $Y_2O_3$, and yttria-containing materials), titanium oxides (e.g., TiO, $TiO_2$, and $Ti_2O_3$), zirconium oxides (e.g., $ZrO_2$ or zirconia), hafnium oxides ($HfO_2$), vanadium oxides (e.g., $V_2O_5$, VO, $VO_2$, $V_2O_3$, $V_3O_7$, $V_4O_9$, and $V_6O_{13}$), niobium oxides (e.g., NbO, $NbO_2$, and $Nb_2O_5$), tantalum oxides (e.g., $Ta_2O_5$), chromium oxides (e.g., $Cr_2O_3$ and $CrO_2$), molybdenum oxides (e.g., $MoO_3$ and $MoO_2$), tungsten oxides (e.g., $W_2O_3$, $WO_2$, and $WO_3$), manganese oxides (e.g., MnO, $Mn_3O_4$, $Mn_2O_3$, and $MnO_2$), rhenium oxides (e.g., $ReO_2$, $ReO_3$, and $Re_2O_7$), iron oxides (e.g., $Fe_2O_3$ and its different forms, FeO, and $Fe_3O_4$), ruthenium oxides (e.g., $RuO_2$), cobalt oxides (e.g., CoO and $Co_3O_4$), rhodium oxide, iridium oxide, nickel oxides (e.g., NiO), palladium oxide, platinum oxide, copper oxides ($Cu_2O$ and CuO), silver oxide ($Ag_2O$), zinc oxide (ZnO), cadmium oxide (CdO), and the corresponding transition metal sulfides, selenides, and tellurides. Some examples of transition metal pnictides include the vanadium nitrides (e.g., VN), titanium nitrides (e.g., TiN), yttrium nitrides (e.g., YN), zirconium nitrides (e.g., ZrN), and tungsten nitrides (e.g., $WN_2$).

In a fifth embodiment, the target material and/or resulting phase-separated layer includes at least one rare earth metal chalcogenide (e.g., oxide, sulfide, selenide, or telluride of a lanthanide or actinide element having an atomic number of 57-103) or at least one rare earth metal pnictide (e.g., nitride, phosphide, or arsenide of a lanthanide or actinide element having an atomic number of 57-103). Some particular rare earth metal chalcogenides considered herein are rare earth metal oxides of the general formula $(RE)_2O_3$, wherein RE represents one or a combination of rare earth metals. Some examples of rare earth metals that can substitute for RE in the foregoing formula include yttrium (Y), lanthanum (La), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or thorium (Th), or a combination thereof. Other rare earth metal oxides include those based on the general formulas (RE)O or $(RE)O_2$, such as $CeO_2$ (ceria). The corresponding rare earth metal sulfides, selenides, and tellurides are also contemplated herein. Some examples of rare earth metal nitrides include lanthanum nitride (LaN), europium nitride (EuN), and ytterbium nitride (YbN).

In a sixth embodiment, the target material and/or resulting phase-separated layer includes at least one perovskite-type oxide according to the chemical formula:

$$M'M''O_3 \qquad (1)$$

In formula (1), M' and M" are independently monovalent, divalent, trivalent, tetravalent, or pentavalent metal ions, provided that the sum of oxidation states of M' and M" add to +6 to charge balance with oxide atoms. For example, M' can be a monovalent metal ion and M" a pentavalent metal ion, or M' can be a divalent metal ion and M" a tetravalent metal ion, or M' and M" can both be trivalent metal ions. The corresponding perovskite-type sulfides, selenides, and tellurides are also contemplated herein.

Some examples of perovskite-type materials wherein M' is a monovalent metal ion and M" is a pentavalent metal ion include $LiNbO_3$, $LiTaO_3$, $NaNbO_3$, $NaTaO_3$, $CuNbO_3$, $CuTaO_3$, $AgNbO_3$, and $AgTaO_3$. Some examples of perovskite-type materials wherein M' is a divalent metal ion and M" is a tetravalent metal ion include the zirconates (e.g., $MgZrO_3$, $CaZrO_3$, $SrZrO_3$, $BaZrO_3$, $FeZrO_3$, $CoZrO_3$, $NiZrO_3$, $ZnZrO_3$, $PbZrO_3$, and $CdZrO_3$), the titanates (i.e., of the general formula $M'TiO_3$ wherein M' is a divalent metal ion, e.g., $MgTiO_3$, $CaTiO_3$, $SrTiO_3$, $BaTiO_3$, $FeTiO_3$, $CoTiO_3$, $NiTiO_3$, $ZnTiO_3$, $PbTiO_3$, and $CdTiO_3$), $PbIrO_3$, $PbNbO_3$, the cerates (e.g., $MgCeO_3$, $CaCeO_3$, $SrCeO_3$, $BaCeO_3$, $FeCeO_3$, $CoCeO_3$), $MgWO_3$, $CaWO_3$, $FeWO_3$, the ruthenates (e.g., $MgRuO_3$, $CaRuO_3$, $SrRuO_3$, $BaRuO_3$), and the metasilicates (e.g., $MgSiO_3$, $CaSiO_3$, $SrSiO_3$, $BaSiO_3$, $FeSiO_3$, $CoSiO_3$, $NiSiO_3$, $ZnSiO_3$, $PbSiO_3$, and $CdSiO_3$). Some examples of perovskite-type materials wherein M' and M" are both trivalent metal ions include materials of the general formulas $(RE)M''O_3$, $M'MnO_3$, and $(RE)MnO_3$, wherein RE represents any one or combination of the rare earth metals (in trivalent form) described above. In particular embodiments, M' and M" independently represent any one or combination of metal ions selected from trivalent transition metal, main group, and rare earth metal ions.

The formula $(RE)M''O_3$ can encompass, for example, any of the subclasses $YM''O_3$, $LaM''O_3$, $CeM''O_3$, $PrM''O_3$, $NdM''O_3$, $PmM''O_3$, $SmM''O_3$, $EuM''O_3$, $GdM''O_3$, $TbM''O_3$, $DyM''O_3$, $HoM''O_3$, $ErM''O_3$, $TmM''O_3$, $YbM''O_3$, and $LuM''O_3$, wherein M" represents one or a combination of trivalent metal ions, or in particular embodiments, one or a combination of metals selected from trivalent transition metals, trivalent rare earth metals, and/or trivalent main group metals. Some examples of $LaM''O_3$ compounds or materials include $LaCrO_3$, $LaMnO_3$ (i.e., "LMO"), $LaFeO_3$, $LaCoO_3$, $LaNiO_3$, $LaCuO_3$, $La(Ni,Cr)O_3$, $La(Mn,Ni)O_3$, $La(Mn,Cr)O_3$, $La(Mn,Fe)O_3$, $LaVO_3$, $LaAlO_3$, $LaGaO_3$, $LaNbO_3$, $LaTaO_3$, $LaGdO_3$, and $LaTmO_3$. Some examples of other $(RE)M''O_3$ compounds or materials include, for example, $YCrO_3$, $YMnO_3$, $YFeO_3$, $YCoO_3$, $YNiO_3$, $YVO_3$, $YAlO_3$, $YGaO_3$, $YGdO_3$, $YbCrO_3$, $DyCrO_3$, $NdCrO_3$, $SmCrO_3$, $NdVO_3$, $NdGaO_3$, $NdAlO_3$, $TbVO_3$, $EuNbO_3$, $GdFeO_3$, $CdMnO_3$, $NiMnO_3$, $CeMnO_3$, $NdMnO_3$, $SmMnO_3$, $EuMnO_3$, $GdMnO_3$, $TbMnO_3$, $DyMnO_3$, $HoMnO_3$, $ErMnO_3$, $TmMnO_3$, $YbMnO_3$, $LuMnO_3$, $ThMnO_3$, $PrMnO_3$, $(La,Ce)MnO_3$, $(Ce,Gd)MnO_3$, and $(La,Eu)MnO_3$. Where a combination of metals is shown in parentheses (i.e., generic metals A,B), the molar proportion of one metal to the other can be denoted according to the formula $A_xB_y$, wherein the sum of x and y is 1 and neither x nor y is zero (i.e., y=1−x, where x can be, for example, 0.05, 0.1, 0.2, 0.3, 0.4, 0.5, 0.6, 0.7, 0.8, 0.9, 0.95, or within a range bounded by any two of the foregoing values).

In a seventh embodiment, the target material and/or resulting phase-separated layer includes at least one spinel-type oxide according to the formula $$M'M''_2O_4 \qquad (2)$$

In formula (2), M' and M" are independently monovalent, divalent, trivalent, tetravalent, pentavalent, or hexavalent metal ions, provided that the sum of oxidation states of M' and M" add to +8 to charge balance with oxide atoms. For example, M' can be a divalent metal ion and M" a trivalent metal ion, or can be a tetravalent metal ion and M" a divalent metal ion. The corresponding spinel-type sulfides, selenides, and tellurides are also contemplated herein.

Some examples of spinel-type materials according to formula (2) wherein M' is a divalent metal ion and M" is a trivalent metal ion include materials of the general formula M'V$_2$O$_4$ wherein M' is a divalent metal (e.g., MnV$_2$O$_4$, FeV$_2$O$_4$, CoV$_2$O$_4$, NiV$_2$O$_4$, CuV$_2$O$_4$, ZnV$_2$O$_4$, CdV$_2$O$_4$, MgV$_2$O$_4$, CaV$_2$O$_4$, SrV$_2$O$_4$, BaV$_2$O$_4$, and PbV$_2$O$_4$), materials of the general formula M'Cr$_2$O$_4$ wherein M' is a divalent metal (e.g., MnCr$_2$O$_4$, FeCr$_2$O$_4$, CoCr$_2$O$_4$, NiCr$_2$O$_4$, CuCr$_2$O$_4$, ZnCr$_2$O$_4$, CdCr$_2$O$_4$, MgCr$_2$O$_4$, CaCr$_2$O$_4$, SrCr$_2$O$_4$, BaCr$_2$O$_4$, and PbCr$_2$O$_4$), materials of the general formula M'Mn$_2$O$_4$ wherein M' is a divalent metal (e.g., FeMn$_2$O$_4$, CoMn$_2$O$_4$, NiMn$_2$O$_4$, CuMn$_2$O$_4$, ZnMn$_2$O$_4$, CdMn$_2$O$_4$, MgMn$_2$O$_4$, CaMn$_2$O$_4$, SrMn$_2$O$_4$, BaMn$_2$O$_4$, TiMn$_2$O$_4$, and PbMn$_2$O$_4$), materials of the general formula M'Fe$_2$O$_4$ wherein M' is a divalent metal (e.g., MnFe$_2$O$_4$, CoFe$_2$O$_4$, NiFe$_2$O$_4$, CuFe$_2$O$_4$, ZnFe$_2$O$_4$, CdFe$_2$O$_4$, MgFe$_2$O$_4$, CaFe$_2$O$_4$, SrFe$_2$O$_4$, BaFe$_2$O$_4$, TiFe$_2$O$_4$, and PbFe$_2$O$_4$), materials of the general formula M'Co$_2$O$_4$ wherein M' is a divalent metal (e.g., MnCo$_2$O$_4$, NiCo$_2$O$_4$, CuCo$_2$O$_4$, ZnCo$_2$O$_4$, CdCo$_2$O$_4$, MgCo$_2$O$_4$, CaCo$_2$O$_4$, SrCo$_2$O$_4$, BaCo$_2$O$_4$, TiCo$_2$O$_4$, and PbCo$_2$O$_4$), materials of the general formula M'Ni$_2$O$_4$ wherein M' is a divalent metal (e.g., MnNi$_2$O$_4$), materials of the general formula M'B$_2$O$_4$ wherein M' is a divalent metal (e.g., MnB$_2$O$_4$, NiB$_2$O$_4$, CuB$_2$O$_4$, ZnB$_2$O$_4$, CdB$_2$O$_4$, MgB$_2$O$_4$, CaB$_2$O$_4$, SrB$_2$O$_4$, BaB$_2$O$_4$, TiB$_2$O$_4$, and PbB$_2$O$_4$), materials of the general formula M'Al$_2$O$_4$ wherein M' is a divalent metal (e.g., MnAl$_2$O$_4$, NiAl$_2$O$_4$, CuAl$_2$O$_4$, ZnAl$_2$O$_4$, CdAl$_2$O$_4$, MgAl$_2$O$_4$, CaAl$_2$O$_4$, SrAl$_2$O$_4$, BaAl$_2$O$_4$, TiAl$_2$O$_4$, and PbAl$_2$O$_4$), materials of the general formula M'Ga$_2$O$_4$ wherein M' is a divalent metal (e.g., MnGa$_2$O$_4$, NiGa$_2$O$_4$, CuGa$_2$O$_4$, ZnGa$_2$O$_4$, CdGa$_2$O$_4$, MgGa$_2$O$_4$, CaGa$_2$O$_4$, SrGa$_2$O$_4$, BaGa$_2$O$_4$, TiGa$_2$O$_4$, and PbGa$_2$O$_4$), materials of the general formula M'In$_2$O$_4$ wherein M' is a divalent metal (e.g., MnIn$_2$O$_4$, NiIn$_2$O$_4$, CuIn$_2$O$_4$, ZnIn$_2$O$_4$, CdIn$_2$O$_4$, MgIn$_2$O$_4$, CaIn$_2$O$_4$, SrIn$_2$O$_4$, BaIn$_2$O$_4$, TiIn$_2$O$_4$, and PbIn$_2$O$_4$), and materials of the general formula M'(RE)$_2$O$_4$ wherein M' is a divalent metal and RE is a rare earth lanthanide or actinide trivalent metal, and more particularly, of the general formula M'La$_2$O$_4$ wherein M' is a divalent metal (e.g., MnLa$_2$O$_4$, NiLa$_2$O$_4$, CuLa$_2$O$_4$, ZnLa$_2$O$_4$, CdLa$_2$O$_4$, MgLa$_2$O$_4$, CaLa$_2$O$_4$, SrLa$_2$O$_4$, BaLa$_2$O$_4$, and TiLa$_2$O$_4$, PbLa$_2$O$_4$). M' and/or M" can also represent a combination of metals, such as in (Fe, Mg)Cr$_2$O$_4$, (Fe,Mg)Cr$_2$O$_4$, (BaCu)$_2$Cr$_2$O$_4$, Ca(V,Cr)$_2$O$_4$, Ba(Fe,Co)$_2$O$_4$, and (Ca,Sr)(Mn,Fe)$_2$O$_4$.

Some examples of spinel-type materials according to formula (2) wherein M' is a tetravalent metal ion and M" is a divalent metal ion include SiMg$_2$O$_4$, SiNi$_2$O$_4$, SiZn$_2$O$_4$, SiCu$_2$O$_4$, ZrMg$_2$O$_4$, ZrNi$_2$O$_4$, ZrZn$_2$O$_4$, and ZrCu$_2$O$_4$.

In an eighth embodiment, the target material and/or phase-separated layer includes at least two components independently selected from any of the metal oxide, sulfide, selenide, telluride, nitride, phosphide, arsenide, and antimonide compounds or materials described above. Some examples of combinations of these components include, for example, two metal oxide components, one metal oxide and one metal sulfide component, two metal sulfide components, one metal oxide and one metal selenide component, two selenide components, one metal oxide and one metal telluride component, one metal sulfide and one metal selenide component, two metal nitride components, one metal oxide and one metal nitride component, one metal oxide and one metal phosphide component, one metal oxide and one metal arsenide component, one metal nitride and one metal phosphide, one metal nitride and one metal arsenide, and so on.

In a ninth embodiment, the target material (and/or phase-separated layer) includes at least two components selected from at least one alkali metal oxide and at least one metal oxide of any class or type. In a first case, at least two of the components are selected from alkali metal oxides. In a second case, at least one of the components is selected from alkali metal oxides and at least one of the components is selected from alkaline earth metal oxides. In a third case, at least one of the components is selected from alkali metal oxides and at least one of the components is selected from main group metal oxides. In a fourth case, at least one of the components is selected from alkali metal oxides and at least one of the components is selected from transition metal oxides. In a fifth case, at least one of the components is selected from alkali metal oxides and at least one of the components is selected from rare earth metal oxides. In a sixth case, at least one of the components is selected from alkali metal oxides and at least one of the components is selected from perovskite-type metal oxides according to formula (1). In a seventh case, at least one of the components is selected from alkali metal oxides and at least one of the components is selected from spinel-type metal oxides according to formula (2).

In a tenth embodiment, the target material (and/or phase-separated layer) includes at least two components selected from at least one alkaline earth metal oxide and at least one metal oxide of any class or type. In a first case, at least two of the components are selected from alkaline earth metal oxides. In a second case, at least one of the components is selected from alkaline earth metal oxides and at least one of the components is selected from main group metal oxides. In a third case, at least one of the components is selected from alkaline earth metal oxides and at least one of the components is selected from transition metal oxides. In a fourth case, at least one of the components is selected from alkaline earth metal oxides and at least one of the components is selected from rare earth metal oxides. In a fifth case, at least one of the components is selected from alkaline earth metal oxides and at least one of the components is selected from perovskite-type metal oxides according to formula (1). In a sixth case, at least one of the components is selected from alkaline earth metal oxides and at least one of the components is selected from spinel-type metal oxides according to formula (2).

In an eleventh embodiment, the target material (and/or phase-separated layer) includes at least two components selected from at least one main group metal oxide and at least one metal oxide of any class or type. In a first case, at least two of the components are selected from main group metal oxides. In a second case, at least one of the components is selected from main group metal oxides and at least one of the components is selected from transition metal oxides. In a third case, at least one of the components is selected from main group metal oxides and at least one of the components is selected from rare earth metal oxides. In a fourth case, at least one of the components is selected from main group metal oxides and at least one of the components is selected from perovskite-type metal oxides according to formula (1). In a fifth case, at least one of the components is selected from main group metal oxides and at least one of the components is selected from spinel-type metal oxides according to formula (2).

In a twelfth embodiment, the target material (and/or phase-separated layer) includes at least two components selected from at least one transition metal oxide and at least one metal oxide of any class or type. In a first case, at least two of the components are selected from transition metal oxides. In a second case, at least one of the components is selected from transition metal oxides and at least one of the components is selected from rare earth metal oxides. In a third case, at least one of the components is selected from transition metal oxides and at least one of the components is selected from perovskite-type metal oxides according to formula (1). In a fourth case, at least one of the components is selected from transition metal oxides and at least one of the components is selected from spinel-type metal oxides according to formula (2).

In a thirteenth embodiment, the target material (and/or phase-separated layer) includes at least two components selected from at least one rare earth metal oxide and at least one metal oxide of any class or type. In a first case, at least two of the components are selected from rare earth metal oxides. In a second case, at least one of the components is selected from rare earth metal oxides and at least one of the components is selected from perovskite-type metal oxides according to formula (1). In a third case, at least one of the components is selected from rare earth metal oxides and at least one of the components is selected from spinel-type metal oxides according to formula (2).

In a fourteenth embodiment, the target material (and/or phase-separated layer) includes at least two components selected from at least one perovskite-type metal oxide according to formula (1) and at least one metal oxide of any class or type. In a first case, at least two of the components are selected from perovskite-type metal oxides according to formula (1). In another case, at least one of the components is selected from perovskite-type metal oxides according to formula (1) and at least one of the components is selected from spinel-type metal oxides according to formula (2).

In a fifteenth embodiment, the target material (and/or phase-separated layer) includes at least two components selected from at least one spinel-type metal oxide according to formula (2) and at least one metal oxide of any class or type. For example, in a paticular case, at least two of the components are selected from spinel-type metal oxides according to formula (2). Other particular examples of these combinations have been given above.

In a particular embodiment, the target material (and/or phase-separated layer) includes at least one alkaline earth metal oxide component and at least one perovskite-type metal oxide component according to the formula $(RE)M''O_3$ wherein RE is a rare earth trivalent metal ion selected from any of the rare earth metals described above. In more specific embodiments, the target material (and/or phase-separated layer) includes at least one alkaline earth metal oxide component and at least one perovskite-type metal oxide component according to the subformula $(RE)MnO_3$ or $LaM''O_3$ wherein M'' is a trivalent metal ion. In a more specific embodiment, the target material (and/or phase-separated layer) includes at least one alkaline earth metal oxide component and at least one perovskite-type metal oxide component according to the subformula $LaM''O_3$ wherein M'' is a trivalent transition metal ion. In a more specific embodiment, the target material (and/or phase-separated layer) includes at least one alkaline earth metal oxide component and a perovskite-type metal oxide component of formula $LaMnO_3$. In more specific embodiments, the alkaline earth metal oxide component is MgO for any of the specific embodiments described above.

In another particular embodiment, the target material (and/or phase-separated layer) includes at least one alkaline earth metal oxide component and at least one spinel-type metal oxide component according to the subformula $M'Fe_2O_4$ wherein M' is a divalent metal ion. In a more specific embodiment, the target material (and/or phase-separated layer) includes at least one alkaline earth metal oxide component and at least one spinel-type metal oxide component of formula $CoFe_2O_4$. In more specific embodiments, the alkaline earth metal oxide component is MgO for any of the specific embodiments described above.

In another particular embodiment, the target material (and/or phase-separated layer) includes at least one spinel-type metal oxide component of formula (2) and at least one perovskite-type metal oxide component according to formula (1) wherein, in the formula $M'M''O_3$ of formula (1), one of M' and M'' is divalent while another is tetravalent. In a more specific embodiment, the target material (and/or phase-separated layer) includes at least one spinel-type metal oxide component of formula (2) and at least one perovskite-type metal oxide component according to the subformula $M'TiO_3$ wherein M' is a divalent metal ion. In a more specific embodiment, the target material (and/or phase-separated layer) includes at least one spinel-type metal oxide component of formula (2) and at least one perovskite-type metal oxide component according to the subformula $M'TiO_3$ wherein M' is an alkaline earth metal ion. In a more specific embodiment, the target material (and/or phase-separated layer) includes at least one spinel-type metal oxide component of formula (2) and a perovskite-type metal oxide component of formula $BaTiO_3$. In more specific embodiments, the spinel-type metal oxide component is according to the formula $M'M''_2O_4$ of formula (2), wherein M' is a divalent metal ion and M'' is a trivalent metal ion, for any of the specific embodiments described above. In other specific embodiments, the spinel-type metal oxide component is according to the subformula $M'Fe_2O_4$ wherein $M^1$ is a divalent metal ion, for any of the specific embodiments described above. In other specific embodiments, the spinel-type metal oxide component is according to the subformula $CoFe_2O_4$, for any of the specific embodiments described above.

In another particular embodiment, the target material (and/or phase-separated layer) includes at least one spinel-type metal oxide component of formula (2) and at least one perovskite-type metal oxide component according to formula (1) wherein, in the formula $M'M''O_3$ of formula (1), M' and M'' are both trivalent metal ions. In a more specific embodiment, the target material (and/or phase-separated layer) includes at least one spinel-type metal oxide component of formula (2) and at least one perovskite-type metal oxide component according to the subformula $(RE)M''O_3$ or $(RE)MnO_3$, wherein RE is a rare earth trivalent metal ion selected from any of the rare earth metals described above. In a more specific embodiment, the target material (and/or phase-separated layer) includes at least one spinel-type metal oxide component of formula (2) and at least one perovskite-type metal oxide component according to the subformula $LaM''O_3$, wherein M'' is a trivalent metal ion. In a more specific embodiment, the target material (and/or phase-separated layer) includes at least one spinel-type metal oxide component of formula (2) and a perovskite-type metal oxide of formula $LaMnO_3$. In more specific embodiments, the spinel-type metal oxide component is according to the formula $M'M''_2O_4$ of formula (2), wherein M' is a divalent metal ion and M'' is a trivalent metal ion, for any of the specific embodiments described above. In other specific embodiments, the spinel-type metal oxide component is according to the subformula $M'Fe_2O_4$ wherein M' is a divalent metal ion, for any of the specific embodiments described above. In other specific embodiments, the spinel-type metal oxide component is according to the subformula $CoFe_2O_4$, for any of the specific embodiments described above.

In yet another particular embodiment, the target material (and/or phase-separated layer) includes at least one perovskite-type metal oxide component according to the formula M'M"O$_3$ of formula (1) and at least one spinel-type metal oxide component of formula (2) wherein, in the formula M'M"$_2$O$_4$ of formula (2), M' is a divalent metal ion and M" is a trivalent metal ion. In a more specific embodiment, the target material (and/or phase-separated layer) includes at least one perovskite-type metal oxide component according to formula (1) and at least one spinel-type metal oxide component according to the subformula M'Fe$_2$O$_4$ wherein M' is a divalent metal ion. In a more specific embodiment, the target material (and/or phase-separated layer) includes at least one perovskite-type metal oxide component according to formula (1) and at least one spinel-type metal oxide component of formula CoFe$_2$O$_4$. In other specific embodiments, the perovskite-type metal oxide is according to the formula (RE)M"O$_3$, (RE)MnO$_3$, LaM"O$_3$, or LaMnO$_3$, for any of the specific embodiments described above.

The components in the target material need not be of equivalent chemical structure to the components in the phase-separated layer. For example, the target components may react with each other or the primary substrate or with a gaseous reactive component during the deposition procedure to form a new phase-separated component in the deposited layer.

Each of the target components in the target material is necessarily present in a weight, volume, or molar percentage of less than 100% with respect to the total weight of target material. For example, in different embodiments, the percentage of one component can be about, or less than, or greater than 99%, 98%, 95%, 90%, 85%, 80%, 75%, 70%, 65%, 60%, 55%, 50%, 45%, 40%, 35%, 30%, 25%, 20%, 15%, 10%, 5%, 2%, or 1%, or within a range bounded by any two of the foregoing percentages. In the case where strictly two target components are used the amount of first target material can be represented as "A" while the amount of the second target material can be represented as "100−A". In the case where three target components are used, the amount of the first and second target components can be represented as "A" and "B", respectively, while the amount of the third target material can be represented as "100−A−B" (and so on, for additional target components). By adjustment of the percentage of components in the target material, an adjustment can be made in the percentage of one component with respect to another component in the deposited film. Accordingly, the spacing between nanophase features can also be adjusted.

The two or more target components can be in a mixed or separated state during the sputtering process. In the mixed state, the target components can be mixed to any suitable degree of homogeneity. For example, a mixture of target components can be finely mixed (e.g., variable regions can be evident only on the microscale, i.e., less than 1 micron, or nanoscale), or coarsely mixed (e.g., variable regions are evident on a size scale greater than 1, 10, 100, or 500 microns).

In particular embodiments, the target material includes a perovskite (e.g., (RE)M"O$_3$, (RE)MnO$_3$, or LaMnO$_3$) in combination with an alkaline earth metal oxide (e.g., MgO), or an alkali metal oxide, or an alkaline earth metal oxide, or a main group metal oxide (particularly, Group III main group metal oxides, such as Al$_2$O$_3$). In more particular embodiments, the target material includes only a perovskite and an alkaline earth metal oxide, or only a perovskite and an alkali metal oxide, or only a perovskite and an alkaline earth metal oxide, or only a perovskite and a main group metal oxide. In the foregoing embodiments, the total amount of components in the target material (e.g., perovskite and alkaline earth metal oxide) sums to 100%. In various embodiments, the amount of perovskite (i.e., "A") is selected from any of the exemplary values recited above, and the amount of one or more other components is understood to be "100−A".

Adjustments in the density, distribution, or feature sizes in the phase-separated layer can provide a desired modulation of defects in the subsequently deposited superconducting film. These adjustments can be achieved by judicious selection, adjustment, or optimization of the conditions used in the sputtering technique. The corresponding modulation of defects in the superconducting film can include, for example, an adjustment or optimization of the density, distribution, interspacing, or columnar width, of or between defect features (including filaments) present in the superconducting film. Modulation of defects in the superconducting film can serve to, for example, optimize the extent of AC loss reduction, flux pinning, or the current density value.

The primary substrate is the substrate upon which the phase-separated layer is deposited. The primary substrate can be any suitable substrate that contains an ordered surface, as particularly known and used in the field of superconducting tapes and films. The ordered surface is typically a result of molecular-level organization, such as found in a crystalline or polycrystalline surface. The primary substrate is typically a biaxially-textured substrate, such as any of the biaxially-textured substrates known in the art, as further described below.

Any of the biaxially-textured substrates known in the art can be used as the primary substrate on which the phase-separated layer is deposited. The term "biaxially-textured substrate" as used herein is meant to be synonymous with the related term "sharply biaxially-textured substrate." By one definition, a biaxially-textured substrate is a polycrystalline substrate wherein the grains are aligned within a specific angular range with respect to one another, as would generally be found on the surface of a bulk single crystal. A polycrystalline material having biaxial texture of sufficient quality for electromagnetic applications can be generally defined as having an x-ray diffraction phi scan peak of no more than 20° full-width-half-maximum (FWHM) and an omega-scan of 10° FWHM. The X-ray phi-scan and omega-scan measure the degree of in-plane and out-of-plane texture, respectively. An example of biaxial texture is the cube texture with orientation {100}<100>, wherein the (100) crystallographic plane of all grains is parallel to the substrate surface and the [100] crystallographic direction is aligned along the substrate length.

Other suitable definitions can also be used for defining a biaxially-textured substrate. For example, a biaxially-textured substrate can be defined as a substrate having a crystallographic orientation such that the substrate possesses a FWHM within 7°, preferably within 5°, and more preferably within 3° throughout the crystal. Furthermore, the biaxially-textured substrate need not be polycrystalline (i.e., multi-grained), but may be single-crystalline (i.e., single-grained).

Several types of biaxially-textured substrates are known, all of which are suitable for the purposes herein. Among them, a class of primary substrates suitable for use herein is the class of rolling assisted, biaxially-textured substrates (RABiTS). The RABiTS method produces a polycrystalline substrate having primarily low angle gain boundaries. Further details of the RABiTS technique and formed substrates can be found in, for example, A. Goyal, et al., *J. of Materials Research*, vol. 12, pgs. 2924-2940, 1997, and D. Dimos et al., *Phys. Rev. B*, 41:4038-4049, 1990, the disclosures of which are incorporated herein by reference.

The RABiTS technique provides a simple method for fabricating long lengths of biaxially-textured substrates with primarily low-angle grain boundaries. These substrates have been widely employed for the epitaxial deposition of high temperature superconducting (HTS) materials. A number of U.S. patents directed to the RABiTS process and related process variants have been issued. These include U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768; 6,399,154; 6,451,450; 6,447,714; 6,440,211; 6,468,591; 6,486,100; 6,599,346; 6,602,313; 6,607,313; 6,607,838; 6,607,839; 6,610,413; 6,610,414; 6,635,097; 6,645,313; 6,537,689, 6,663,976, 6,670,308; 6,675,229; 6,716,795; 6,740,421; 6,764,770; 6,784,139; 6,790,253; 6,797,030; 6,846,344; 6,782,988; 6,890,369; 6,902,600; and 7,087,113, the disclosures of which are incorporated herein by reference in their entireties. Of particular relevance in the above list of patents are U.S. Pat. Nos. 7,087,113, 5,739,086, 5,741,377, 5,898,020, 5,958,599 and 5,944,966.

In a preferred embodiment, a RABiTS substrate is prepared generally as follows. Briefly, a deformed metal substrate with a very well-developed copper-type (Cu-type) rolling texture is first provided. The metal can be any suitable metal, and typically a FCC type of metal (e.g., Cu, Co, Mo, Cd, Pd, Pt, Ag, Al, Ni, and their alloys), and more preferably, nickel and its alloys (e.g., NiW). A substrate with a Cu-type rolling texture can be readily identified, as known in the art, and as disclosed in, for example, U.S. Pat. No. 7,087,113. For example, a Cu-type rolling texture generally exhibits the characteristic that the X-ray intensity in the pole figures is concentrated on the β-fiber in Euler space of orientation representation. In other words, a Cu-type rolling texture is generally characterized by an orientation of all the grains in the material lying on the β-fiber. The β-fiber is defined as the tube or fiber running from the B through the S to the C point in Euler space. Cu-type rolling texture is generally best shown using pole figures of (111), (200), and (220) from the substrate or drawing the orientations in Euler Space. Next, the metal with Cu-type rolling texture is annealed at a temperature higher than its secondary recrystallization temperature to provide exaggerated grain growth such that a single grain consumes other grains to form an essentially single crystalline (i.e., single grain) type of material (hereinafter, a "single crystal substrate").

Typically, at least one buffer layer is epitaxially deposited on the surface of the single crystal substrate. The function of the buffer layer is typically as a chemical barrier between the single crystal substrate and the superconducting layer, thereby preventing reaction between these layers while epitaxially transmitting the ordered crystalline structure of the single crystal substrate to the superconducting layer. Some examples of buffer layers include $CeO_2$, yttria-stabilized zirconia (YSZ), $(RE)_2O_3$, wherein RE can be any of the metals already defined above (e.g., $Y_2O_3$), $LaM'O_3$, wherein M' is a transition or main group metal (e.g., $LaAlO_3$, $LaGaO_3$, $LaMnO_3$, $LaCrO_3$, $LaNiO_3$), lanthanum zirconate (e.g., $La_2Zr_2O_7$), $SrTiO_3$ (and its Nb-doped analog), $NdGaO_3$, $NbTiO_3$, MgO, TiN, $TiB_2$, Pd, Ag, Pt, and Au. Some common RABiTS architectures include, for example, a four-layer architecture, such as $CeO_2/YSZ/Y_2O_3/Ni/Ni$—W, and a three-layer architecture, such as $CeO_2/YSZ/CeO_2/Ni$—W.

Another type of biaxially-textured substrate includes the ion-beam-assisted deposition (IBAD) substrate. IBAD processes and resulting substrates are described in, for example, U.S. Pat. Nos. 6,632,539, 6,214,772, 5,650,378, 5,872,080, 5,432,151, 6,361,598, 5,872,080, 6,756,139, 6,884,527, 6,899,928, and 6,921,741, the disclosures of which are incorporated herein by reference in their entireties. Typically, an IBAD substrate is characterized by an MgO layer (i.e., "IBAD-MgO") biaxially grown using ion assist on an $Al_2O_3/Y_2O_3$-coated polycrystalline nickel-based alloy (generally, Hastelloy) base substrate. The Hastelloy substrate is typically deposited on a polycrystalline copper layer. The $Al_2O_3$ layer serves primarily as a barrier to prevent upward diffusion of substrate components (i.e., functions as a diffusion barrier layer) while the $Y_2O_3$ layer serves as a seed layer for the IBAD-MgO nucleation. Often, a homo-epitaxial MgO (i.e., homo-epi MgO) layer is epitaxially grown on the IBAD-MgO layer to improve the texture of the IBAD-MgO layer. A texture-transferring capping layer, typically a perovskite layer, such as $LaMnO_3$ (LMO), $SrRuO_3$, or $SrTiO_3$ (but, more typically, LMO) is deposited on the homo-epi MgO layer, or directly on the IBAD-MgO layer. The texture-transferring layer functions to transfer the texture of the MgO layer to the superconducting layer, i.e., wherein the superconducting layer is generally deposited on the capping perovskite layer. An exemplary and widely used IBAD architecture is $Al_2O_3/Y_2O_3/IBAD-MgO/homo-epi\ MgO/LMO$.

Yet another type of biaxially-textured substrate includes the inclined-substrate deposition (ISD) substrate. In the ISD process, the resulting substrate has rotated cube texture and the rotation can be as high as 40-45°. ISD processes and resulting substrates are described in, for example, U.S. Pat. Nos. 6,190,752 and 6,265,353, the disclosures of which are incorporated herein by reference in their entireties. In both the IBAD and ISD processes, a biaxially-textured layer is deposited on a flexible, polycrystalline, untextured substrate.

The primary substrate considered herein possesses an ordered (i.e., typically, biaxially-textured) surface upon which the phase-separated layer is deposited. The ordered surface can be, for example, any of the layers described above that are typically included in a biaxially textured primary substrate, such as found in a RABiTS, IBAD, or ISD substrate. For example, the surface may be a crystalline or polycrystalline (e.g., epitaxial) layer of a metal oxide (e.g., $CeO_2$, $ZrO_2$, $Al_2O_3$, $Y_2O_3$, or YSZ), metal (e.g., Ni, Cu), or metal alloy (e.g., Ni—W). In a particular embodiment, the surface is a crystalline, polycrystalline, or epitaxial layer of an alkaline earth metal oxide, such as MgO.

In a particular embodiment, the phase-separated layer is deposited on an IBAD-MgO layer of an IBAD primary substrate in the absence of a homo-epi MgO layer. In another particular embodiment, the phase-separated layer is deposited on a homo-epi MgO layer deposited on an IBAD-MgO layer. In another particular embodiment, the phase-separated layer is deposited directly on a Hastelloy substrate.

The primary substrate surface on which the phase-separable components are epitaxially deposited can influence an effect on the growth mechanisms of the phase-separated components. Accordingly, the primary substrate surface can be appropriately selected or modified in order to adjust, modulate, or optimize crystallographic and other morphological characteristics of the epitaxially-gown phase-separated layer.

The primary substrate surface can also be any of the materials described above for the target components, or a combination thereof. For example, in a particular embodiment, the primary substrate surface is a spinel-type oxide according to the formula $M'M''_2O_4$, wherein M' and M'' are independently monovalent, divalent, trivalent, tetravalent, pentavalent, or hexavalent, provided that the sum of oxidation states of M' and M'' add to +8 to charge balance with oxide atoms. In a specific embodiment, the substrate surface is characterized in that M' and M'' in the formula $M'M''_2O_4$ are, respectively, a divalent and trivalent metal ion. In a more specific embodiment, the substrate surface is characterized by the subformula M'Fe$_2$O$_4$ wherein M' is a divalent metal ion. In a specific embodiment, the substrate surface is characterized by the formula CoFe$_2$O$_4$.

In another particular embodiment, the primary substrate surface is a perovskite-type metal oxide according to the formula M'M"O$_3$, wherein M' and M" are independently monovalent, divalent, trivalent, tetravalent, or pentavalent provided that the sum of oxidation states of M' and M" add to +6 to charge balance with oxide atoms. In a specific embodiment, the substrate surface is characterized in that M' and M" in the formula M'M"O$_3$ are, respectively, a divalent and tetravalent metal ion. In a more specific embodiment, the substrate surface is characterized by the subformula M'TiO$_3$ wherein M' is a divalent metal ion. In a more specific embodiment, the substrate surface is characterized in that M' in the subformula M'TiO$_3$ is an alkaline earth metal ion. For example, in specific embodiments, the substrate surface can be a material of composition MgTiO$_3$, CaTiO$_3$, SrTiO$_3$, or BaTiO$_3$. In another embodiment, the substrate surface is characterized in that M' and M" in the formula M'M"O$_3$ are, respectively, both trivalent metal ions. In a more specific embodiment, the substrate surface is characterized by the subformula (RE)M"O$_3$ wherein RE is a trivalent rare earth metal and M" is a trivalent metal. In a more specific embodiment, the substrate surface is characterized by the subformula LaM"O$_3$, wherein M" is a trivalent metal ion. In a more specific embodiment, the substrate surface is characterized by the formula LaMnO$_3$.

In another particular embodiment, the primary substrate surface has a composition according to the formula (RE)$_2$O$_3$, wherein RE is preferably a rare earth lanthanide or actinide metal, as described above. In yet other particular embodiments, the primary substrate surface has an alkali oxide or alkaline earth oxide composition.

In one embodiment, the composition of the ordered surface layer of the primary substrate is different from at least two, or all, components of the target material and/or resulting phase-separated layer. In another embodiment, the composition of the ordered surface layer of the primary substrate is the same as at least one component of the target material and/or resulting phase-separated layer.

The sputtering deposition technique can be any of the deposition techniques known in the art in which a target material and substrate are made to assume opposite polarities within a reduced pressure atmosphere at a voltage difference sufficient to induce gas-phase sputtering of the target material, thereby resulting in the ejection of atoms of the target material and their deposition on the substrate. The invention incorporates by reference all of the knowledge in the art pertaining to the concept, design, and operation of sputtering techniques useful for deposition of a film onto a substrate, as treated by, for example, K. Wasa, S. Hayakawa, *Handbook of Sputter Deposition Technology, Principles, Technology and Applications*, Noyes Publications, (c) 1992, and *Glow Discharge Processes, Sputtering and Plasma Etching*, John Wiley & Sons, Inc., (c) 1980, of which the contents pertaining to sputtering deposition techniques are incorporated herein in their entirety.

As is well known in the art, a sputtering process operates by the general principle that the voltage established between the target material and substrate causes an acceleration of electrons, which, in turn, causes ionization of the gaseous medium (sputter gas) as the electrons collide with gas molecules. The resulting ionized gas molecules, which are positively charged, are made to accelerate toward the target material when the target material is held at a negative charge. The impact of the ionized gas molecules on the target material causes the ejection of atoms of the target material and their deposition onto the substrate.

Sputtering techniques provide several advantages over other deposition techniques, such as evaporative and pulsed laser deposition (PLD) techniques. For example, sputtering techniques permit materials of complex composition or structure (e.g., alloys, compounds, or multi-element materials) to be deposited in a facile manner with preservation of the stoichiometry and/or structure of the original target composition. Sputtering techniques also permit high melting point materials to be deposited on a substrate in a facile manner without the problems (such as high temperature breakdown) associated with vaporization techniques. Furthermore, since sputtered atoms arrive at the substrate with high kinetic energy and with various angles of incidence, sputtering techniques generally provide non-porous and dense films with improved adherence to (and coverage of) the substrate. In addition, sputtering techniques can be more easily integrated into complex and large-scale industrial assemblies.

In a first exemplary embodiment, the sputtering deposition technique is a direct current (DC) sputtering technique. In a DC sputtering system, the target material is typically oriented as the cathode (i.e., negatively charged) while the substrate is typically oriented as the anode (i.e., positively charged with respect to the cathode). Generally, in a DC sputtering system, the polarity applied to the target material and substrate is fixed (i.e., does not change or fluctuate) through the duration of the deposition. The applied voltage is generally at least about 100 volts (100 V) and up to about 5 kilovolts (5 kV). In different embodiments, the applied voltage may be about, at least, or no more than 100 V, 150 V, 200 V, 250 V, 300 V, 350 V, 400 V, 450 V, 500 V, 550 V, 600 V, 650 V, 700 V, 750 V, 800 V, 850 V, 900 V, 950 V, 1 kV, 1.5 kV, 2 kV, 2.5 kV, 3 kV, 3.5 kV, 4 kV, 4.5 kV, or 5 kV, or within a range bounded by any two of the foregoing values.

In a second exemplary embodiment, the sputtering deposition technique is a polarity-oscillating technique, such as a radiofrequency (RF) sputtering technique. In a polarity-oscillating technique, the voltage bias between target material and substrate is alternated at a particular frequency. The alternating polarity results in the alternating bombardment of the target by positively-charged ions and electrons. At least one advantage of the polarity-oscillating technique is that the alternate bombardment of the target by ions and electrons (as induced by the oscillating polarity) prevents the build-up of charge on the target, particularly on an insulating target. Another advantage of the polarity-oscillating technique is that lower operating pressures can be used as compared to DC sputtering techniques, primarily as a result of a more efficient use of the electron impact ionization. The polarity oscillation is typically in the radiofrequency range (i.e., for RF sputtering), and more typically, at a frequency within the range of 10-20 MHz, 10-15 MHz, or 12-14 MHz, or, in a preferred embodiment, 13.56 MHz.

In a third exemplary embodiment, the sputtering deposition technique is an ion-beam sputtering (IBS) technique. The IBS method produces an ion source in a compartment separate from where the target is contained, and then directs a focused (i.e., collimated) ion beam at the target. The ions leaving the source are typically neutralized by electrons from a second external source. An advantage of IBS is that the energy and flux of ions can be independently adjusted and/or optimized. In addition, since the impacting species are generally neutral (i.e., without charge), IBS can be used for sputtering of both conducting and insulating targets. A variation of IBS is ion-assisted deposition (IAD), in which a secondary ion beam is focused on a substrate, in tandem with the sputtered source of target material also focused on the substrate, such that the secondary ion beam modifies or optimizes the deposition characteristics of the sputtered target material. IAD can, therefore, be used to modify or optimize the structural characteristics of the film deposited on the substrate.

Any of the sputtering deposition techniques contemplated herein can, in addition, be a magnetron sputtering technique. As used herein, a "magnetron sputtering technique" is any sputtering technique in which electrons (and resulting ions of sputter gas) are confined in a region near the target surface by a magnetic (or electromagnetic) field. The magnetic field (typically of several hundred gauss) can be established by, for example, placing a permanent magnet or solenoid near or within a cathode target. As known in the art, the precise magnitude of the magnetic field employed depends to a large extent on the distance from the cathode target (sputtering gun). By confining the electrons close to the target, a significantly increased amount of ionizing collisions occurs near the target surface as compared to the amount of collisions that occur without the magnetic-induced confinement. The increased ionizing collisions advantageously results in a significantly increased sputtering rate of the target material, and hence, a significantly increased deposition rate, as compared to sputtering techniques that do not include a magnetic-induced confinement.

Preferably, the technique employs means to adjust the distance between the target and substrate. In preferred embodiments, the depositions are conducted with the substrate being about 4, 5, or 6 cm (and more preferably, about 5 cm) above the cathode target.

Two magnetron sputtering techniques particularly considered herein are DC magnetron sputtering and RF magnetron sputtering. In the DC magnetron sputtering technique, a DC sputtering technique, as described above, is modified by also including magnetic confinement of electrons close to the target. In the RF magnetron sputtering technique, a RF sputtering technique, as described above, is modified by also including magnetic confinement of electrons close to the target. The magnetron sputtering system can have any of the designs and arrangements known in the art, such as a cylindrical type or planar type magnetron sputtering system.

Any of the sputtering deposition techniques contemplated herein can, in addition, be a reactive sputtering technique. In a reactive sputtering technique, sputtered material chemically reacts with (and generally, combines with) at least some portion of the gaseous medium. For example, titanium oxide can be produced by a reactive sputtering technique in which titanium is used as a target in a gaseous medium containing oxygen; or, for example, silicon nitride can be produced by a reactive sputtering technique in which silicon is used as a target in a gaseous medium containing nitrogen. A reactive sputtering technique may also be used to adjust or optimize the stoichiometry of a composition, e.g., to further oxidize an oxygen-deficient perovskite material, such as an oxygen-deficient LMO.

Two reactive sputtering techniques particularly considered herein are DC reactive sputtering and RF reactive sputtering. In the DC reactive sputtering technique, a DC sputtering technique, as described above, is modified by also including in the gaseous medium one or more gaseous components that react with the sputtered target material. In the RF reactive sputtering technique, a RF sputtering technique, as described above, is modified by also including in the gaseous medium one or more gaseous components that react with the sputtered target material. By the same principle, the reactive sputtering technique can also be a magnetron sputtering technique, such as a DC reactive magnetron sputtering technique or a RF reactive magnetron sputtering technique.

Any of the sputtering deposition techniques contemplated herein can, in addition, be modified to operate in a pulsed mode. The pulsed sputtering technique can be, for example, a pulsed DC sputtering technique, such as bipolar pulsed DC sputtering, or a pulsed magnetron sputtering technique, such as high power impulse magnetron sputtering (HIPIMS).

The sputter gas is generally composed, in at least a major proportion, of an inert gas. The inert gas particularly considered herein is a noble gas, most notably argon (Ar), or alternatively, helium (He), neon (Ne), krypton (Kr), or xenon (Xe). Nitrogen ($N_2$) can also be an inert gas when used with a target material not reactive with nitrogen. Some other gases that may be used, either as an inert or reactive gas (depending on the conditions), include hydrogen ($H_2$), oxygen ($O_2$), carbon dioxide ($CO_2$), carbon monoxide (CO), water ($H_2O$), ammonia ($NH_3$), a nitrogen oxide (e.g., NO, $NO_2$, $N_2O$), ozone ($O_3$), a sulfur oxide (e.g., $SO_2$), hydrogen halide (e.g., HF or HCl), or a gaseous hydrocarbon or fluorocarbon (e.g., $CH_4$, $CH_2F_2$, $CF_4$, $C_2H_6$, $C_2F_6$). A combination of any two or more of these gases may also be used. Some particular combinations of sputter gases considered herein include argon-hydrogen (e.g., Ar-4% $H_2$), argon-oxygen (e.g., Ar-4% $O_2$), argon-nitrogen (e.g., Ar-10% $N_2$), argon-water, nitrogen-hydrogen, nitrogen-oxygen, nitrogen-water, $CF_4$-nitrogen, $CF_4$-hydrogen, $CF_4$-oxygen, and $CF_4$—$H_2O$ mixtures. In particular, water vapor may be included in minute amounts (e.g., $1-5\times10^{-5}$ Torr, or a sub-range therein) in order to oxidize a sputtered target material such that the stoichiometric ratio of non-oxygen to oxygen elements is suitably adjusted or optimized.

The sputtering techniques considered herein are generally conducted at a reduced pressure. Generally, the pressure is reduced to a pressure less than about $120\times10^{-3}$ Torr (i.e., 120 mTorr). In different embodiments, depending on the type of sputtering technique being used, the operating pressure can preferably be about, at least, or no more than 110, 100, 90, 80, 70, 60, 50, 40, 30, 20, 15, 12, 11, 10, 9, 8, 7, 6, 5, 4, 3, 2, 1, 0.5, 0.4, 0.3, 0.2, 0.1, 0.05, or 0.01 mTorr, or a pressure within a range bounded by any two of the foregoing exemplary values. Typically, a DC sputtering technique is practiced using an operating pressure at or above 30 mTorr. Typically, a RF sputtering technique or magnetron sputtering technique is practiced using an operating pressure below 30 mTorr. In addition to the operating pressure, the sputtering technique can employ a suitable base pressure (i.e., background pressure of the system). Typically, a suitable base pressure is no more than about $5\times10^{-5}$ Torr. For example, in different embodiments, the base pressure can be about, at least, or no more than $4\times10^{-5}$ Torr, $3\times10^{-5}$ Torr, $2\times10^{-5}$ Torr, $1\times10^{-5}$ Torr, $9\times10^{-6}$ Torr, $8\times10^{-6}$ Torr, $7\times10^{-6}$ Torr, $6\times10^{-6}$ Torr, $5\times10^{-6}$ Torr, $4\times10^{-6}$ Torr, $3\times10^{-6}$ Torr, $2\times10^{-6}$ Torr, or $1\times10^{-6}$ Torr, or a base pressure within a range bounded by any two of the foregoing exemplary values.

In the sputtering deposition method considered herein, the substrate is typically heated in order to make the deposition process more efficient. The temperature at which the substrate is heated is also referred to as the "sputter temperature". Generally, a sputter temperature of at least 500° C. is employed. In different embodiments, the sputter temperature can preferably be about, at least, or no more than 400° C., 425° C., 450° C., 475° C., 500° C., 520° C., 550° C., 575° C., 600° C., 625° C., 650° C., 675° C., 700° C., 725° C., 750° C., 775° C., 800° C., 825° C., 850° C., 875° C., or 900° C., or a sputter temperature within a range bounded by any two of the foregoing exemplary values. In one embodiment, the sputter temperature is maintained at a specific temperature, or substantially maintained at a specific temperature (i.e., within ±5° C. of a specific temperature), during the sputtering operation. In another embodiment, the sputter temperature is changed (i.e., by more than ±5° C.) during the sputtering operation. In different embodiments, the sputter temperature is increased, or decreased, or increased to a peak temperature and decreased, or decreased to a base temperature and then increased, during the sputtering operation. In some embodiments, the sputter temperature is changed at a constant or substantially constant rate (i.e., linear or substantially linear rate), while in other embodiments, the sputter temperature is changed by a changing (i.e., non-linear) rate during the sputtering process.

The sputtering time (i.e., time that target is being sputtered and deposited on substrate) is very much dependent, first, on the desired thickness of the film (i.e., longer sputtering times generally produce thicker films), and second, on the conditions employed (e.g., sputtering pressure, sputter temperature, sputtering power, and overall sputtering efficiency) in the sputtering technique. Accordingly, in some embodiments, the sputtering time can be as short as a few minutes (e.g., 1, 2, 3, 4, 5, 10, or 15 minutes), while in other embodiments, the sputtering time can be, for example, 20, 30, 40, 50, 60, 70, 80, 90, 100, 110, 120, 150, 180 minutes, or more.

The thickness of the film deposited on the substrate is, generally, desirably at least 5 nm thick. In different embodiments, the film deposited on the substrate is preferably about, at least, or no more than 5 nm, 10 nm, 15 nm, 20 nm, 25 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm, 490 nm, 500 nm, 550 nm, 600 nm, 650 nm, 700 nm, 750 nm, 800 nm, 850 nm, 900 nm, 950 nm, 1000 nm, 1100 nm, 1200 nm, 1300 nm, 1400 nm, or 1500 nm, or a thickness within a range bounded by any two of the foregoing values.

The sputter power is generally at least 20 Watts (20 W). In different embodiments, the sputter power is about, at least, or no more than about 20, 30, 40, 50, 60, 70, 80, 90, 100, 110, 120, 130, 140, 150, 160, 170, 180, 190, or 200 Watts, or a power within a range bounded by any two of the foregoing values.

The sputter power and other conditions are preferably adjusted such that a deposition rate of at least 0.01 nm/s is attained. In different embodiments, conditions of the sputtering process are adjusted such that a deposition of about or at least 0.01, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, or 0.20 nm/s is attained.

In a preferred embodiment, particularly in the case of hygroscopic substrate surfaces (such as MgO), a pre-annealing step is performed on the substrate prior to deposition of the target material on the substrate. In a typical pre-annealing step, the substrate is placed in a closed chamber (e.g., the deposition chamber), an annealing gas (preferably, any of the inert sputtering gases described above) is introduced into the chamber, and the pressure is reduced to a suitable low pressure, such as 1, 2, or 3 mTorr, or any of the low pressures described above. The temperature of the substrate can be simultaneously or subsequently increased to a suitable annealing temperature (e.g., 700° C., 720° C., or 740° C., or any of the elevated temperatures described above for the sputter temperature). The temperature is preferably increased at a set rate, such as 80° C./min., 90° C./min., 100° C./min., 110° C./min., 120° C./min., 130° C./min., 140° C./min., or 150° C./min. Once the substrate reaches the desired annealing temperature, the substrate is preferably maintained at the annealing temperature for at least, for example, 10, 15, 30, or 45 minutes, depending on the annealing temperature and other factors.

After a film has been deposited on the substrate by the sputtering process, the substrate is typically cooled to a suitable cooled temperature. The suitable cooled temperature is typically room temperature, which is typically a temperature within about 15-30° C., or about 25° C. In some embodiments, the substrate is rapidly cooled (e.g., at a rate of at least 10, 15, 20, 30, 40, or 50° C./min., or within a range therein), while in other embodiments, the substrate is more slowly cooled (e.g., at a rate if less than 10° C./min., or about 5, 4, 3, 2, or 1° C./min., or within a range therein).

If desired, the resulting substrate with deposited film (i.e., the treated substrate) can be subjected to a post-processing step. The post-processing step can function, for example, to promote, modify, adjust, or optimize a phase separation of components. The post-processing step can be a heating step, cooling step (i.e., below room temperature), pressurization, depressurization, radiation exposure step (e.g., UV, microwave, electron beam, or ion beam radiation), or a chemical exposure step (e.g., contact of the treated substrate with a vapor phase or liquid phase chemical or mixture of chemicals). In one embodiment, the post-processing step is conducted on the substrate material while the substrate is at the temperature assumed upon completion of the sputtering deposition process. In another embodiment, the post-processing step is conducted on the substrate after it has been cooled to, for example, room temperature, and post-processed either in the cooled state or in a subsequently elevated temperature state.

A preferred post-processing step is a heating step, such as a post-annealing step. The heating may be conducted at typical ambient pressure (e.g., 1 atm), reduced pressure (e.g., a pressure below 1 atm, or any of the reduced pressures described above), or elevated pressure (e.g., greater than 1 atm). The heating can be conducted under any suitable atmosphere, such as air, or alternatively, an artificial inert or reactive gas, such as any of the sputter gases and combinations thereof described above. The post-annealing temperature is preferably any of the sputter temperatures described above (e.g., 750-800° C.). The post-annealing time is dependent on several factors, including the applied temperature. In different embodiments, the post-annealing time can be any of the sputtering times given above (e.g., 15 minutes to 2 hours). After the post-annealing step, the treated substrate can be cooled in a gradual or rapid manner, such as described above after sputtering is completed.

In another aspect, the invention is directed to a method for producing a superconducting film or tape containing pinning defects therein. The pinning defects in the superconductor arise by deposition (e.g., epitaxial or non-epitaxial deposition) of the superconductor on the phase-separated layer described above. As used herein, the term "epitaxial deposition", as used for the superconducting film, indicates that at least some portion of the superconducting film is epitaxially deposited on the surface of the phase-separated layer. Reference is made to FIG. 7A, which depicts a typical superconductor-substrate architecture of the art; and FIG. 7B, which depicts an exemplary superconductor-substrate architecture of the invention having a PLD-deposited YBCO layer on an LMO:MgO microstructured layer (for example, as shown in FIG. 1) on an IBAD-MgO/$Y_2O_3$/$Al_2O_3$/Hastelloy primary substrate having particular exemplary thicknesses of the different layers.

Antiphase boundaries in the superconducting film may arise due to crystallographic mismatching between an epitaxially grown superconducting film on one phase-separated component and an epitaxially grown superconducting film on another phase-separated component. The crystallographic mismatching between superconducting film grown on different phase-separated components can be any type of crystallographic mismatching. As understood in the art, an antiphase boundary occurs at the interface of crystalline portions while having the same overall crystallographic orientation. Lattice planes are mismatched across the anti-phase boundary.

In other embodiments, the portions of superconducting film grown on different phase-separated components are crystallographically mismatched by being crystallographically different in either orientation or pattern. For example, superconducting film grown on one phase-separated component can be in-plane rotated compared to superconducting film grown on another phase-separated component, or superconducting film grown on one phase-separated component can be polycrystalline while superconducting film grown on another phase-separated component is substantially or completely crystalline, or superconducting film grown on one phase-separated component can be amorphous (i.e., not crystalline or polycrystalline) while superconducting film grown on another phase-separated component is substantially or completely crystalline.

The superconducting film grown on the phase-separated layer will contain (as propagated through the superconducting film during growth thereof) the nanoscale or microscale features (i.e., morphological features) of the phase-separated layer. The features transmitted through the superconducting film function as defects in the superconducting film. For example, since the features of the phase-separated layer include crystallographic mismatching between different phases, this crystallographic mismatching will be transmitted through the superconducting film and function as defects therein. Since these features from which defects arise are propagated into the superconducting film during epitaxial or non-epitaxial growth of the superconducting film on the phase-separated layer, the features are generally disposed linearly (for example, as columns) in the superconducting film in an orientation generally perpendicular to the surface (or parallel to the direction of film growth). Such defects are also referred to herein as linear defects. However, it is contemplated herein that conditions can be employed that could provide for non-linear (for example, curved or bent) propagation of defects through the superconducting film. Furthermore, it is contemplated that conditions can be employed that could provide for linearly or non-linearly propagated features to depart from a perpendicular orientation to the surface (for example, within +45 to −45 degrees, +60 to −60 degrees, +80 to −80 degrees, or +85 to −85 degrees from the surface).

The thickness (e.g., width) of columnar or other features in the superconducting film arising from the phase-separated layer is generally of nanoscale dimension, i.e., less than 1 μm thick. For example, in different embodiments, column thicknesses can be less than 500 nm, or less than 200 nm, or less than 100 nm, or less than 50 nm, or less than 20 nm, or less than 10 nm. However, larger thicknesses of the columnar features are also contemplated, including those having micron-scale features (e.g., up to 1, 5, 10, or 50 microns). More typically, the average diameter of the nanoscale defects is in the range of 1-100 nm.

In cases where more than one epitaxial orientation of the superconducting film is possible on a phase-separated layer, the conditions for the deposition of the superconducting film can be appropriately adjusted, by methods known in the art, such that the superconducting film is deposited on the phase-separated layer in one of the epitaxial orientations and not the other (i.e., one of the epitaxial orientations is favored). The ability to select epitaxial orientations in this manner provides the capability of incorporating numerous other morphological features into the superconducting film beyond what has been described above.

The superconducting film deposited on the phase-separated layer is preferably any of the high temperature superconductor (HTS) materials known in the art. A high temperature superconducting material is generally characterized by having a superconducting critical temperature ($T_c$) of at least 35 K, and more preferably, greater than 77 K. Currently, a majority of the HTS materials belong to the general class of copper oxide superconducting materials.

In one embodiment, the superconducting film includes a rare-earth (RE) or transition metal (TM) barium copper oxide composition (hereinafter, a "metal-barium-copper-oxide" composition). The rare earth element can be any of the lanthanide or actinide metals listed in the Periodic Table of the Elements (hereinafter, the "Periodic Table") and as exemplified above. The lanthanide metals refer predominantly to the elements of the Periodic Table having an atomic number of 57 to 71. The actinide metals generally refer to any of the elements of the Periodic Table having an atomic number of 90 to 103. The transition metals generally refer to any of the elements located in Groups 3-12 of the Periodic Table (i.e., the corresponding scandium through zinc groups). In a particular embodiment, the metal-barium-copper-oxide material is according to the formula $(RE)Ba_2Cu_3O_7$, wherein RE is a rare earth or transition metal element. Some examples of suitable RE metals include yttrium (Y), neodymium (Nd), gadolinium (Gd), thulium (Tm), ytterbium (Yb), lutetium (Lu), and combinations thereof.

For example, in one embodiment, the superconducting material is a yttrium barium copper oxide (YBCO) material. Any of the yttrium barium copper oxide materials known in the art can be used herein. In one instance, the yttrium barium copper oxide material can be generally described by the formula $YBa_2Cu_3O_{7-x}$, wherein x is generally a number within the approximate range $0 \leq x \leq 1$. As used herein, the formula $YBa_2Cu_3O_7$ is ascribed the same meaning, and includes all of the possible different variations, as encompassed by the former broader formula. Some examples of other types of yttrium barium copper oxide materials include $Y_3Ba_4Cu_7O_{16}$, $Y_2Ba_4Cu_7O_{15}$, $Y_2CaBa_4Cu_7O_{16}$, $(Y_{0.5}Lu_{0.5})Ba_2Cu_3O_7$, $(Y_{0.5}Tm_{0.5})Ba_2Cu_3O_7$, and $(Y_{0.5}Gd_{0.5})Ba_2Cu_3O_7$.

In another embodiment, the high temperature superconducting film includes a thallium-containing barium copper oxide composition. More particularly, the composition may be a thallium barium calcium copper oxide material. Any of the thallium barium calcium copper oxide materials can be used herein. In one instance, the thallium barium calcium copper oxide material includes a composition according to the formula $TlBa_2Ca_{n-1}Cu_nO_{2n+3}$, wherein n is generally a number greater than 1 and up to 4. In another instance, the thallium barium calcium copper oxide material includes a composition according to any of the formulas $Tl_2Ba_2Ca_{n-1}Cu_nO_{2n+2}$, $Tl_2Ba_2Ca_{n-1}Cu_nO_{2n+3}$, or $Tl_2Ba_2Ca_{n-1}Cu_nO_{2n+4}$, wherein n is generally a number greater than 1 and up to 4. Some specific examples of such superconducting compositions include $Tl_2Ba_2Ca_2Cu_3O_{10}$ (TBCCO-2223), $Tl_2Ba_2CaCu_2O_6$, $TlBa_2Ca_2Cu_3O_9$, and $TlBa_2Ca_3Cu_4O_{11}$.

In another embodiment, the high temperature superconducting film includes a mercury-containing barium copper oxide material. More particularly, the composition may be a mercury barium calcium copper oxide material. Any of the mercury barium calcium copper oxide materials can be used herein. In a particular embodiment, the mercury barium calcium copper oxide material includes a composition according to the formula $HgBa_2Ca_{n-1}Cu_nO_{2n+2}$, wherein n is a number greater than 1 and up to 4. Some specific examples of such superconducting compositions include $HgBa_2Ca_2Cu_3O_8$, $HgBa_2Ca_2Cu_4O_{10}$, $HgBa_2(Ca_{1-a}Sr_a)Cu_3O_8$ (wherein $0 \leq a \leq 1$), and $(Hg_{0.8}Tl_{0.2})Ba_2Ca_2Cu_3O_{8+x}$.

In yet another embodiment, the high temperature superconducting film includes a bismuth- and/or strontium-containing calcium copper oxide material. More particularly, the composition may be a bismuth strontium calcium copper oxide (BSCCO) material. Any of the BSCCO materials can be used herein. In a particular embodiment, the BSCCO material includes a composition according to the formula $Bi_2Sr_2Ca_nCu_{n+1}O_{2n+6}$. Some specific examples of such superconducting compositions include $Bi_2Sr_2CaCu_2O_8$ (BSCCO-2212) $Bi_2Sr_2Ca_2Cu_3O_{10}$ (BSCCO-2223), $Bi_2Sr_2CaCu_2O_9$, and $Bi_2Sr_2(Ca_{0.8}Y_{0.2})Cu_2O_8$.

In still another embodiment, the HTS film includes a lanthanum-containing copper oxide material. The lanthanum-containing copper oxide material can include a composition according to the general formula $La_{2-x}M_xCuO_4$, wherein x is greater than zero and less than 2, and M is an alkaline earth metal ion, such as Mg, Ca, Sr, or Ba. Some specific examples of such superconducting materials include $La_{1.85}Ba_{0.15}CuO_4$ (LBCO) and $La_{1.85}Sr_{0.15}CuO_4$ (LSCO).

Any of the superconducting materials described above can include dopant amounts of other metals that may be included to facilitate certain desired properties of the HTS film. Some examples of rare earth dopants include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or a combination thereof. In a particular embodiment, YBCO film compositions are doped with one or more of the above rare earth metals.

The superconducting film can also be composed of one more than one superconducting layer. For example, it may be preferred in certain embodiments to apply a YBCO layer onto a BSCCO layer, or vice-versa.

The superconducting film can be of any suitable thickness. For electrical power applications, the thickness is typically no more than about 5 microns (5 μm) thick, and more typically no more than about 10 μm thick. For example, in different embodiments, the thickness of the superconducting film can be about 5, 4, 3, 2, or 1 μm. However, the thickness is highly dependent on the particular application, and thus, can be of significantly greater thickness (e.g., 10, 15, 20, 25 or more microns), or alternatively, of much lesser thickness (e.g., no more than 1, 0.5, 0.2, or 0.1 microns).

The flux-pinned superconducting films described herein are particularly applied as improved superconducting tapes or wires. As generally understood in the art, a tape or wire generally refers to an article having a width dimension much smaller than its length dimension. The tape or wire can have a length of, for example, at least 0.1 meters (0.1 m), 0.5 m, 1 m, 5 m, 10 m, 50 m, 100 m, 1 km, or more.

The superconducting layer can also be coated with any of a variety of materials that can serve a useful purpose. For example, a non-superconducting metal layer may be applied on the superconducting film to protect the film, such as for corrosion resistance. Alternatively, a coating (e.g., metallic, polymeric, plastic, rubber, paint, or hybrid) can be applied onto the superconducting layer to provide, for example, electrical or magnetic insulation, or a certain level of rigidity or flexibility.

The superconducting film can be deposited by any suitable method known in the art. For example, the superconducting films can be deposited by physical vapor deposition (PVD), chemical vapor deposition (CVD), a sputtering technique (such as any of the sputtering techniques described above), sol-gel, dip coating, electrodeposition, spray pyrolysis, and the like. The PVD technique can be a laser ablation technique, such as pulsed laser deposition (PLD). In another embodiment, the films are deposited by a molecular beam chemical vapor deposition (MOCVD) technique. All of the foregoing techniques are well-known in the art for depositing films of superconducting material.

The superconducting tape produced by the method described herein can be used in place of any traditional wiring. In particular embodiments, the superconducting tape is used in, for example, a fault current limiter, power transmission cable, electromagnet coil (i.e., superconducting magnet), motor, turbine, transformer, pump, compressor, communication device (e.g., radiofrequency device), wireless device, engine (e.g., in motor vehicle), power storage device, or electrical generator.

Examples have been set forth below for the purpose of illustration and to describe the best mode of the invention at the present time. However, the scope of this invention is not to be in any way limited by the examples set forth herein.

EXAMPLE 1

The Substrates

Figure 10:
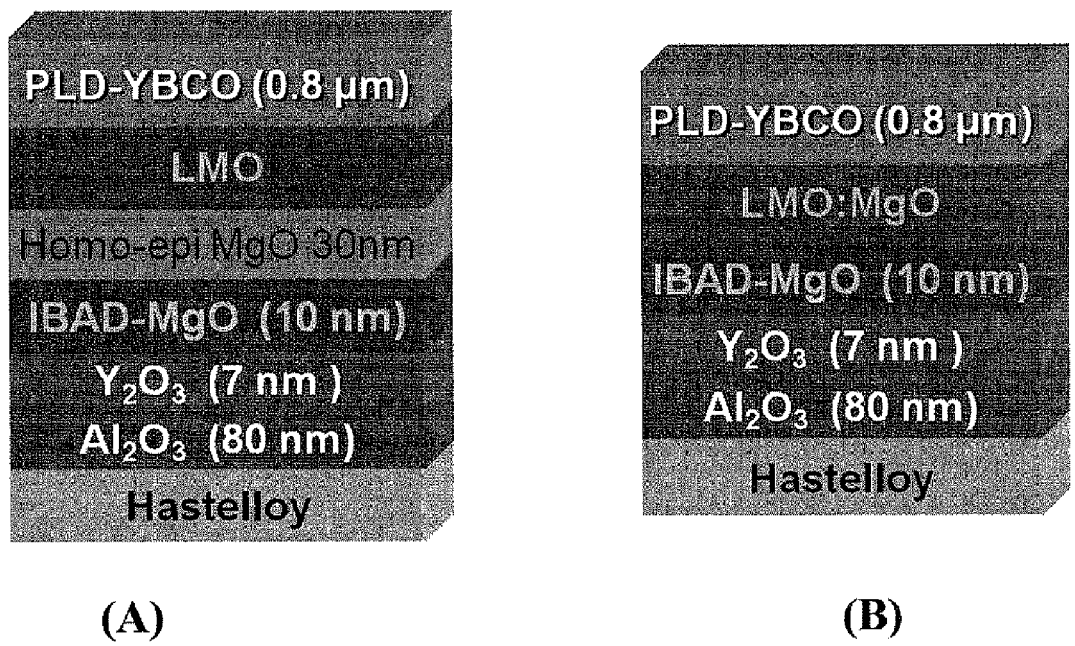
FIGS. 10A, 10B. Drawings comparing a typical superconductor-substrate architecture of the art (FIG. 10A) with an exemplary superconductor-substrate architecture of the invention (FIG. 10B) having a YBCO (PLD-deposited) layer on an LMO:MgO microstructured layer (as shown in FIG. 1) on an IBAD-MgO/$Y_2O_3$/$Al_2O_3$/Hastelloy primary substrate.

RF magnetron sputtering was employed to deposit phase-separated layers on two types of substrates referred to herein as "IBAD-MgO" and "Homo-epi-MgO/IBAD-MgO" substrates or templates. The substrate referred to as "IBAD-MgO" refers to the IBAD-MgO/$Y_2O_3$/$Al_2O_3$/Ni-based alloy substrate as generally depicted in FIG. 10B. The substrate referred to as "Homo-epi-MgO/IBAD-MgO" refers to the Homo-epi-MgO/IBAD-MgO/$Y_2O_3$/$Al_2O_3$/Ni-based alloy substrate as generally depicted in FIG. 1A. The substrates used in this study were fabricated according to the method described in X. M. Xiong, et al., "High Throughput Processing of Long-length IBAD MgO and Epi-buffer Templates at SuperPower", *IEEE Trans. Appl. Supercond.*, 17, 3375 (2007).

IBAD-MgO Substrate

The first layer is an 80 nm-thick $Al_2O_3$ layer that serves as a barrier for upward diffusion of substrate cations. The superior diffusion barrier properties of $Al_2O_3$ for transition metals such as Ni, Cr, Mn, Mo, etc., as well as for oxygen is well-established (P. N. Arendt and S. R. Foltyn, "Biaxially Textured IBAD-MgO Templates for YBCO-coated Conductors", *Mater. Res. Soc. Bull.*, 29, 543 (2004)). The second layer is a 7 nm-thick $Y_2O_3$ seed layer that facilitates IBAD-MgO nucleation (X. M. Xiang, et al., Ibid.). The third layer is an IBAD-MgO layer that requires only a 10 nm thickness to form the optimal biaxial texture (J. R. Groves, et al., "Ion-beam Assisted Deposition of Bi-axially Aligned MgO Template Films for YBCO Coated Conductors", *IEEE. Trans. Appl.*

Supercond., 9, 1964 (1999), and J. R. Groves, et al., "Improvement of IBAD MgO Template Layers on Metallic Substrates for YBCO HTS Depositio", *IEEE Trans. Appl. Supercond.,* 13, 2651 (2003)). These three layers were deposited by sputtering at ambient temperature. In particular, this low-temperature process ensures that the $Al_2O_3$ is amorphous or nanocrystalline, which functions as a better diffusion barrier than polycrystalline $Al_2O_3$ of equivalent thickness. Moreover, the low oxygen diffusion coefficient of MgO ($\sim 10^{-22}$ cm$^2$/s at 800° C.) as well as its structural, chemical, and thermodynamic stability makes it a robust buffer layer component, suitable for subsequent buffer and YBCO deposition temperatures ($\sim$800° C.) and oxygen partial pressures (M-H Yang and C. P. Flynn, "Ca$^{2+}$ and $^{18}$O$^{2-}$ Diffusion in Ultrapure MgO", *J. Phys. Condens. Matter.,* 8, L279 (1996)).

Homo-Epi-MgO/IBAD-MgO Substrate

The Homo-epi-MgO/IBAD-MgO substrate contains the three layers described above. In addition, the Homo-epi-MgO/IBAD-MgO substrate contains a fourth layer of 20 nm thickness of reactively sputtered (approximately at 600° C.) homo-epitaxial MgO. The homo-epi MgO layer ensures structural robustness of IBAD-MgO by further improving the texture and restoring the surface lattice constant to that of the bulk MgO (0.421 nm). (P. N. Arendt, et al., "High Critical Current YBCO Coated Conductors Based on IBAD MgO", *Physica C,* 412, 795 (2004)). The measured lattice constant at the as-deposited surface of IBAD-MgO is known to vary between 0.43-0.44 nm.

EXAMPLE 2

Deposition of a Phase-Separated LMO:MgO Layer on IBAD-MgO and Homo-Epi-MgO/IBAD-MgO Substrates In-Situ Annealing of Substrate Prior to Deposition of LMO:MgO Phase-Separated Layer As the MgO surface is known to be hygroscopic, an annealing process was performed on the substrate of the MgO surface prior to deposition of the phase-separated layer. The annealing process was conducted in a manner that removes surface-adsorbed water and hydrocarbons. Removal of these species ensures a chemically clean surface for the reproducible growth of subsequent LMO:MgO composite layers. The annealing process included the following steps:

1. The annealing gas, in this case, a mixture of Ar, $H_2$ (4%) and $O_2$ (or alternatively, a mixture of Ar, $H_2$ (4%) and water vapor) was introduced into the deposition chamber, and the total chamber pressure adjusted to $5 \times 10^{-3}$ Torr.

2. The temperature of the substrates was increased from room temperature (RT) to 720° C. at a rate of 140° C./min.

3. The substrate was in-situ annealed for 30-45 minutes at 720° C. in the presence of the annealing gas.

4. Following step 3, the pressure in the chamber was set to a sputtering pressure of $5 \times 10^{-3}$ Torr before the sputtering deposition step was started.

Radiofrequency (RF) Sputtering Process Used for Deposition of LMO:MgO Phase-Separated Layer The RF sputtering system used consisted of a vacuum deposition chamber equipped with a halogen lamp heater assembly. The sputter cathode used was a two-inch in diameter commercial Kurt J. Lesker sputter source driven by rf or dc power supplies. The depositions took place in sputter-up configuration. The chamber was pumped down to $10^{-2}$ Torr by a mechanical pump, followed by a turbo pump that further reduced the base-pressure down to $10^{-5}$ Torr. The sputter or annealing gas was delivered into the chamber by MKS mass flow controllers. The pressure of the system was controlled by a manually-operated gate valve.

The sputter target was made from a mixture of stoichiometric LMO powder, prepared by solid state reaction, and commercially available MgO powder (Alfa Aesar, 99.99%), which was packed into a two-inch copper tray. Targets were made with volume percentages (vol. %) of MgO mixed with LMO that ranged from 5-75%. Specifically, 5%, 25%, 50% and 75% MgO mixed LMO powder targets were used in our experiments. Depositions were conducted in a Ar—$H_2$ (4%) and $O_2$ (or in Ar—$H_2$ (4%) and $H_2O$) gas mixture at a substrate temperature of 700° C. This was followed by post-annealing in a tube furnace at 750° C. in 1 atm of flowing Ar gas at ambient temperature in order to further develop the phase segregation.

The following conditions were employed for the RF sputtering deposition of the LMO:MgO phase-separated layer:

Base Pressure (Background pressure of the system): $\sim 2 \times 10^{-5}$ Torr.

Sputter Pressure: $5 \times 10^{-3}$ Torr

Sputter Temperature (Substrate Temperature): 700° C.

Sputter Time: 1 hr 30 min (for IBAD-MgO) or 1 hr (for Homo-epi-MgO/IBAD-MgO)

Sputter Power: 80 Watt

Sputter Gas: For the IBAD-MgO substrate, a mixture of $O_2$ and Ar—$H_2$(4%) with a flow ratio of 2/5, respectively. For the Homo-epi-MgO/IBAD-MgO substrate, a mixture of $H_2O$ and Ar—$H_2$ (4%), where the partial pressure of $H_2O$ is $5 \times 10^{-5}$ Torr.

For the IBAD-MgO substrate, the above procedure resulted in a layer of phase-separated LMO:MgO of 210 nm thickness. For the Homo-epi-MgO/IBAD-MgO substrate, the above procedure resulted in a layer of phase-separated LMO:MgO of 160 nm thickness.

After the above sputtering procedure was completed, the coated substrate was cooled as follows:

1) Gas flow into the chamber was stopped.

2) The temperature was then decreased to room temperature by turning off the power of the substrate heater and waiting for the heater assembly to cool down to room temperature. About two hours was required for the temperature to drop from 720° C. to 24° C. During the cooling procedure, the deposition chamber was maintained under a reduced pressure of about $2 \times 10^{-5}$ Torr.

3) The coated substrates were removed from the deposition chamber at room temperature.

Post-Annealing of the LMO:MgO-Coated Substrate After the Sputtering Deposition Procedure Post-annealing was performed in a pre-heated tube furnace under a flowing Ar atmosphere at 1 atm pressure. The annealing temperature was 750° C. Post-annealing gas was introduced before the samples were inserted into the tube in order to purge out any residual gas. The tube was purged for about 5-10 minutes before introducing the samples therein. Samples were then inserted into the pre-heated furnace with a rod assembly. Annealing time was about two hours. After the post-annealing procedure, the samples were cooled to room temperature by pulling the rod assembly out of the hot zone, during which time the gas flow was maintained at 1 Atm. The cooling process proceeded under gas flow for about 40-50 minutes. The samples were then removed from the furnace.

EXAMPLE 3

Analysis of the Phase-Separated Layers in the LMO:MgO-Coated Substrates

X-Ray Diffraction Measurements

Figure 2:
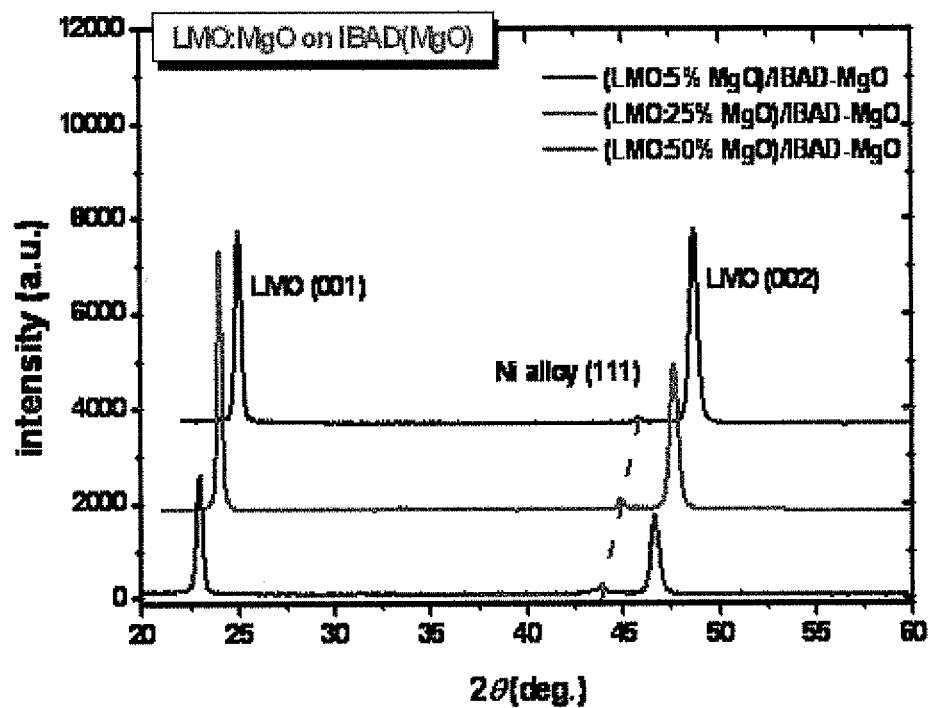
FIG. 2. A series of typical $\theta$-$2\theta$ scans for composite LMO:MgO films, at varying MgO concentrations of 5 vol %, 25 vol %, and 50 vol %, deposited directly on IBAD-MgO templates.

FIG. 2 shows a series of X-ray θ-2θ scans for LMO:MgO composite films, prepared above at varying MgO concentrations of 5 vol %, 25 vol %, and 50 vol %, deposited directly on IBAD-MgO templates. As shown, for all compositions, the films have a preferred c-axis orientation. Due to the absence of a homo-epi layer (the bottom scan) it is difficult to distinguish the MgO peak reflection at this level of display.

Atomic Force Microscopy

Figure 3:
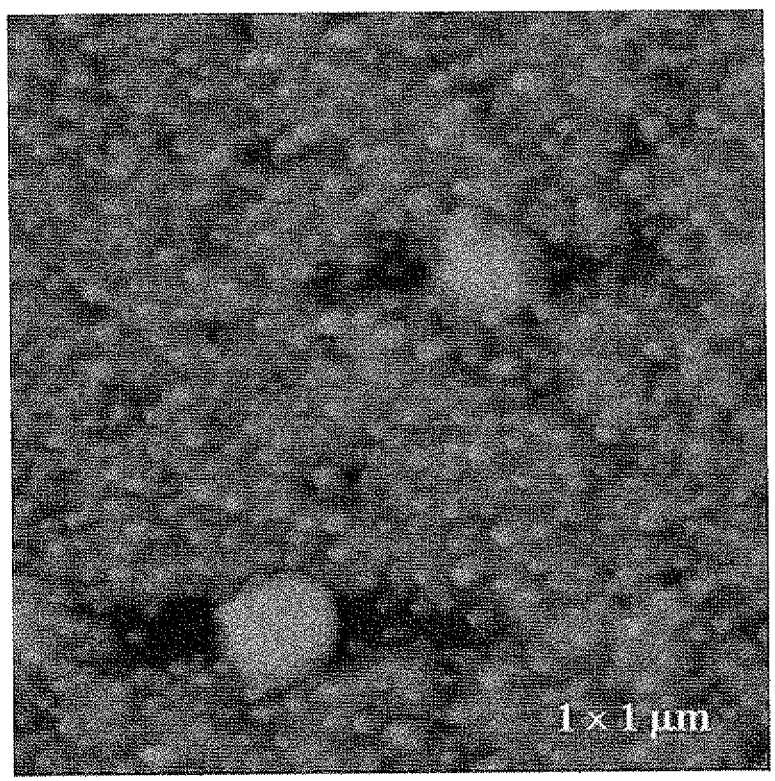
FIG. 3. Atomic force microscopy (AFM) image of a LMO:MgO composite film deposited on an IBAD-MgO template.

FIG. 3 shows the surface morphology of the composite LMO:MgO (25 vol %) film deposited on homo-epi-MgO/IBAD-MgO template (as prepared above) as obtained by an AFM scan. As shown, the AFM scan shows the presence of a high density of bright features. Significantly, a scanning Auger microprobe analysis of these features confirmed that these features are Mg-rich regions, and this evidences two-dimensional projections of phase-separated, vertically-ordered stacks of MgO nanoparticles in the composite film.

Transmission Electron Microscopy (TEM)

Figure 4:
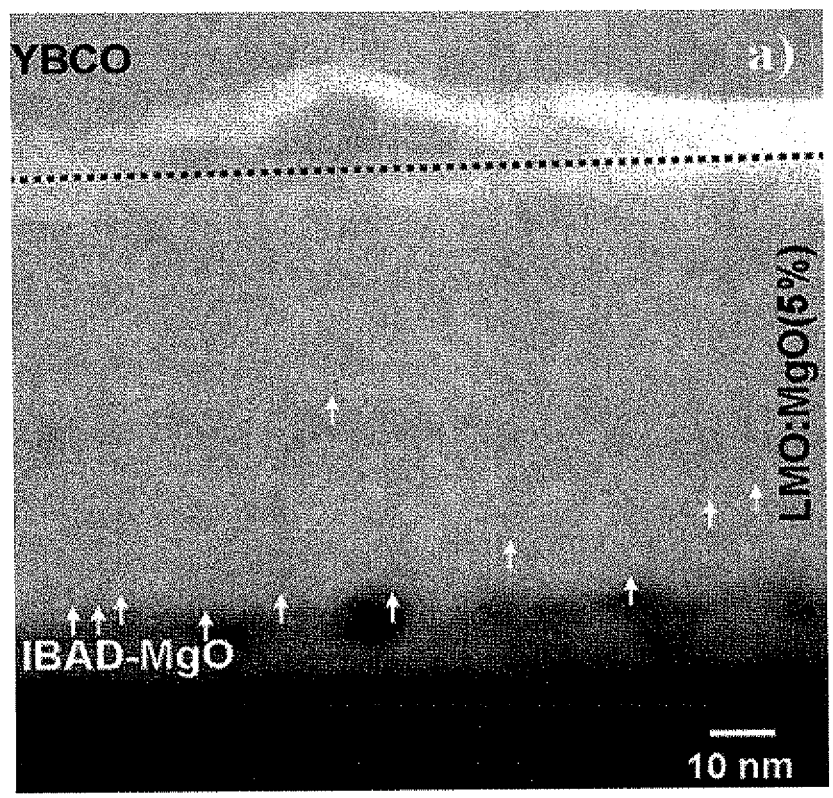
FIG. 4. Z-contrast Scanning Transmission Electron Microscopy (STEM) images of YBCO/LMO:MgO(5%)/IBAD-MgO showing the presence of MgO nanocolumns (dark contrast regions; some are marked with white arrows) extending through the thickness of the film matrix (wherein % indicates vol %).
Figure 5:
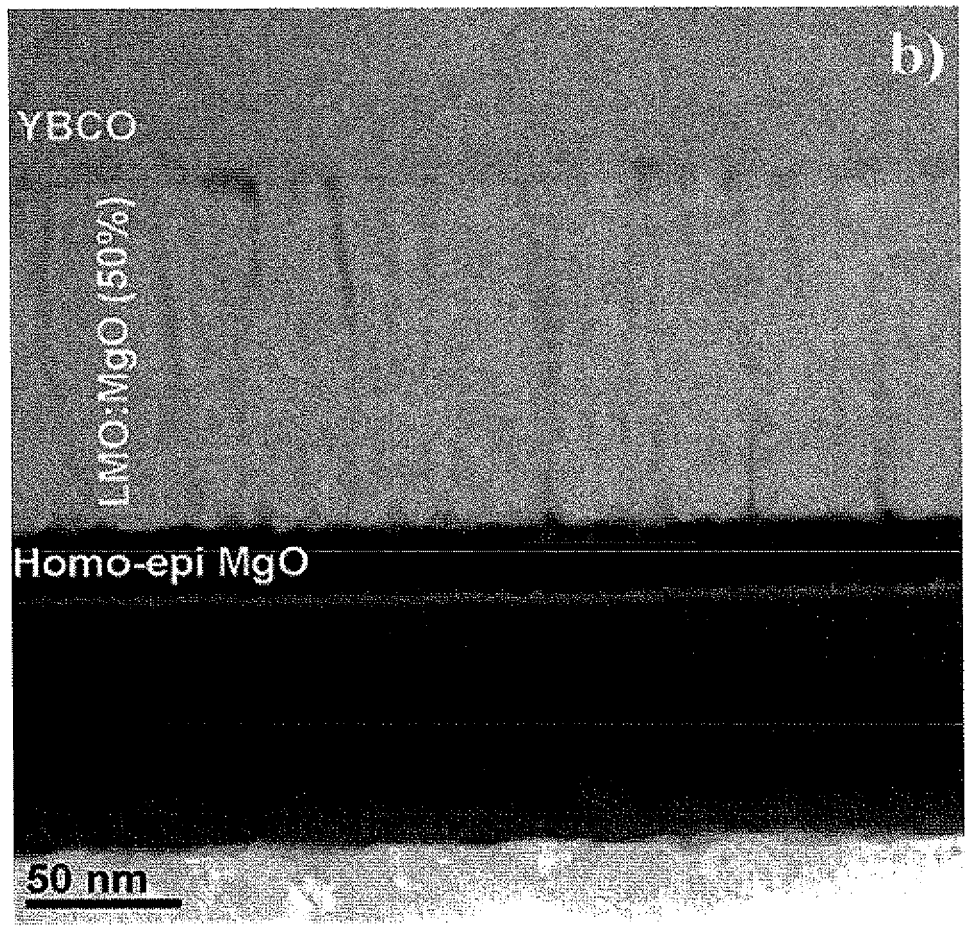
FIG. 5. Z-contrast Scanning Transmission Electron Microscopy (STEM) images of YBCO/LMO:MgO(50%)/homo-epi MgO/IBAD-MgO showing the presence of MgO nanocolumns (dark contrast regions) extending through the thickness of the film matrix (wherein % indicates vol %).

FIGS. 4 and 5 show the detailed cross-sectional microstructure of YBCO-(phase-separated LMO/MgO at 5 vol % MgO)-(IBAD-MgO substrate) and YBCO-(phase-separated LMO/MgO at 50 vol % MgO)-(homo-epi MgO/IBAD-MgO substrate), as evaluated by conventional TEM and Z-contrast microscopy. The images in FIGS. 4 and 5 display the characteristic Z-contrast STEM images of these composite films deposited on IBAD-MgO templates without and with a homo-epi MgO layer, respectively. For two MgO concentrations, the presence of essentially vertical columnar structures (i.e., MgO nanocolumns) within the LMO matrix is clearly evident (see dark contrast regions of MgO structures, some of which are marked with white arrows). As shown, these columns extend throughout the entire thickness of the composite films. As known in the art, in Z-contrast imaging, a higher Z material appears brighter than a lower-Z material. Hence, because of the significant difference in Z between Mg(12) and La(57)/Mn(25), the darker contrast regions observed in these images are the MgO phase while the brighter background represents the LMO matrix. The microstructural analysis of composite buffer films has thus revealed formation of phase-separated, vertically aligned, and self-assembled MgO nanocolumns with a LMO matrix.

Figure 6:
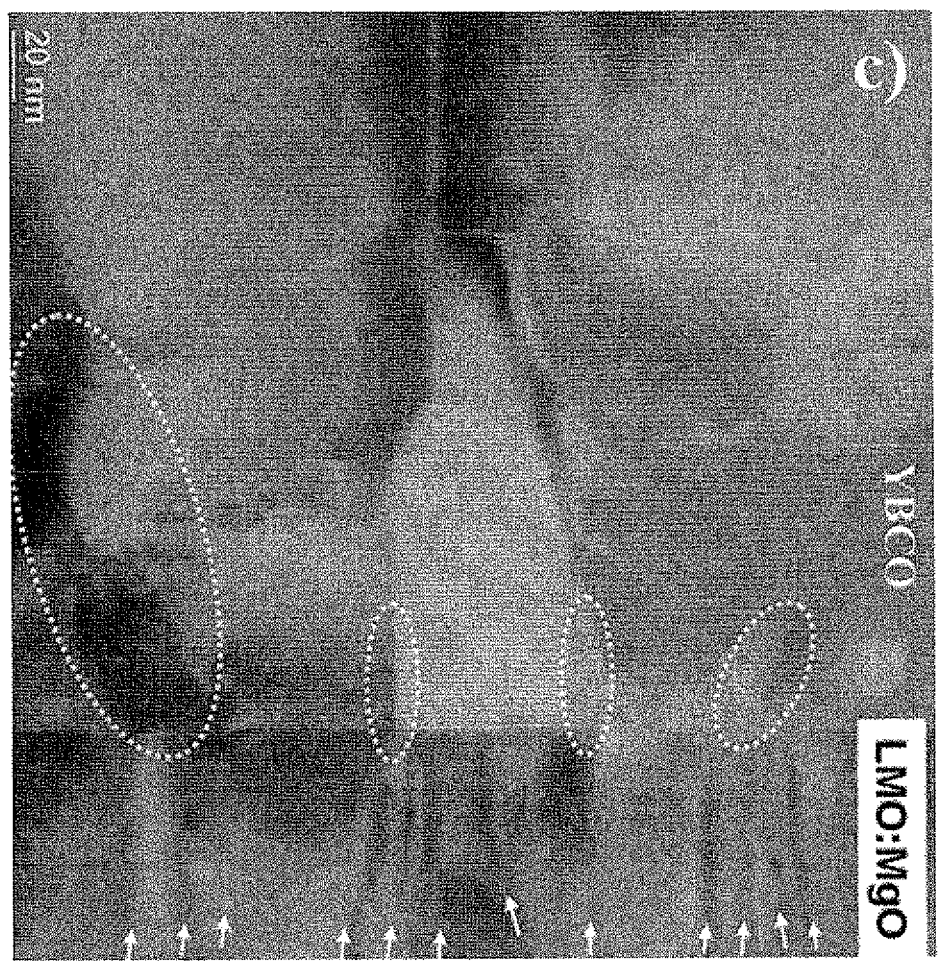
FIG. 6. Cross-sectional high resolution TEM images showing microstructures of the composite LMO:MgO cap layer in YBCO/LMO:MgO(5%)/IBAD-MgO (phase-separated MgO columns are indicated by arrows). Origination of additional c-axis correlated disorder (extended defects) into the YBCO matrix from the vicinity of the MgO nanocolumns is apparent in the figure. Several of these defective regions are marked with dashed ovals.
Figure 7:
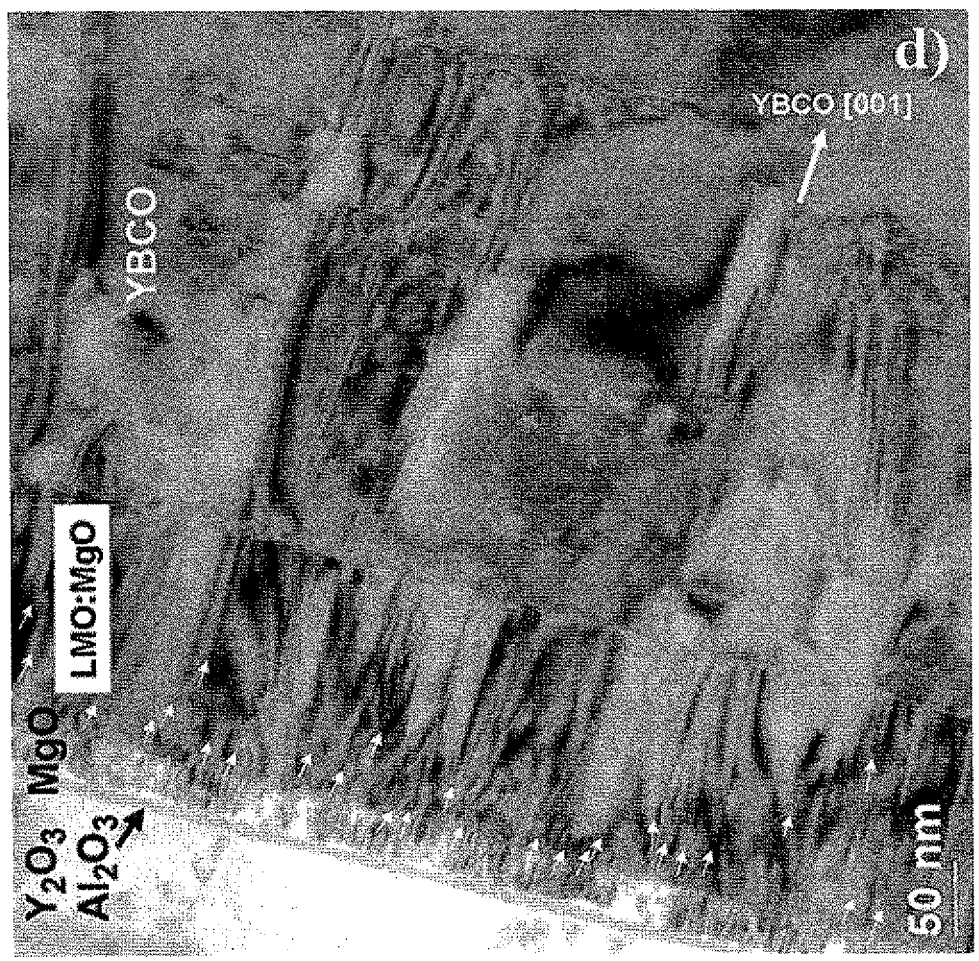
FIG. 7. Cross-sectional high resolution TEM images showing microstructures of the composite LMO:MgO cap layer in YBCO/LMO:MgO(50%)/homo-epi-MgO/IBAD-MgO (phase-separated MgO columns are indicated by arrows). Origination of additional c-axis correlated disorder (extended defects) into the YBCO matrix from the vicinity of the MgO nanocolumns is apparent in the figure.

FIGS. 6 and 7 show high resolution cross-sectional TEM images of the YBCO/LMO:MgO interface for the LMO:MgO(5 vol %)/IBAD-MgO and LMO:MgO(50 vol %)/homo-epi-MgO/IBAD-MgO architectures described above, respectively. The phase-separated MgO columns are indicated by arrows. Origination of additional c-axis correlated disorder (extended defects) into the YBCO matrix from the vicinity of the MgO nanocolumns is apparent from the figures. Several of these defective regions are marked with dashed ovals. The microstructural analysis of composite buffer films revealed formation of chemically phase-separated, vertically aligned, and self-assembled MgO nanocolumns. These MgO columns extend through the entire thickness of the film matrix and induce additional c-axis correlated disorder within the subsequent YBCO films, effectively leading to improved pinning characteristics and higher in-field $J_c$ performance.

Figure 8:
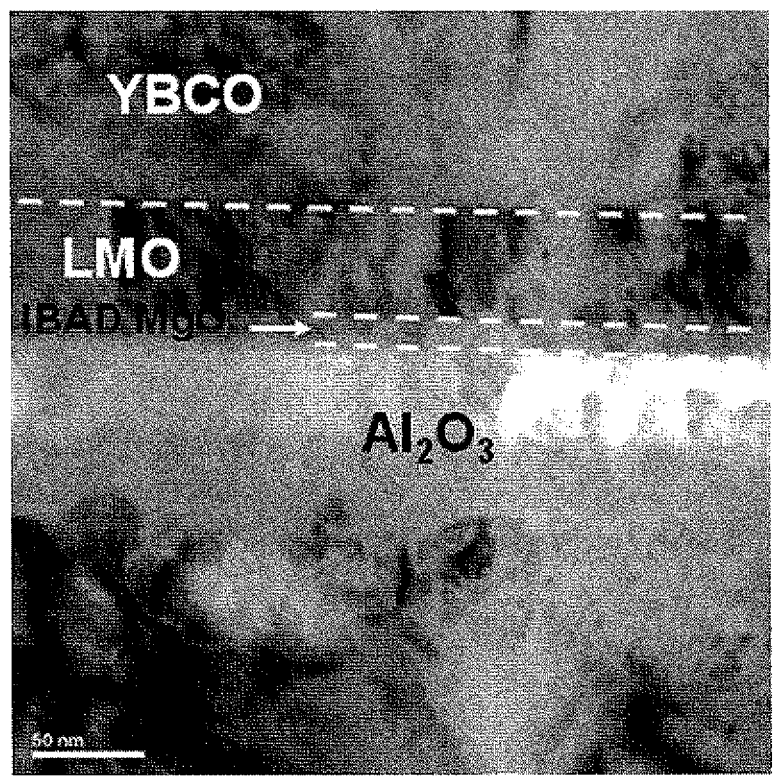
FIG. 8. Cross-sectional TEM image of a PLD-YBCO film deposited on a conventional (i.e., standard, non-phase-separated) LMO/IBAD-MgO template. The interfaces between YBCO and LMO and also between LMO and MgO are flat and clean, without any indication of interfacial reaction or extended defects into the YBCO layer.
Figure 9:
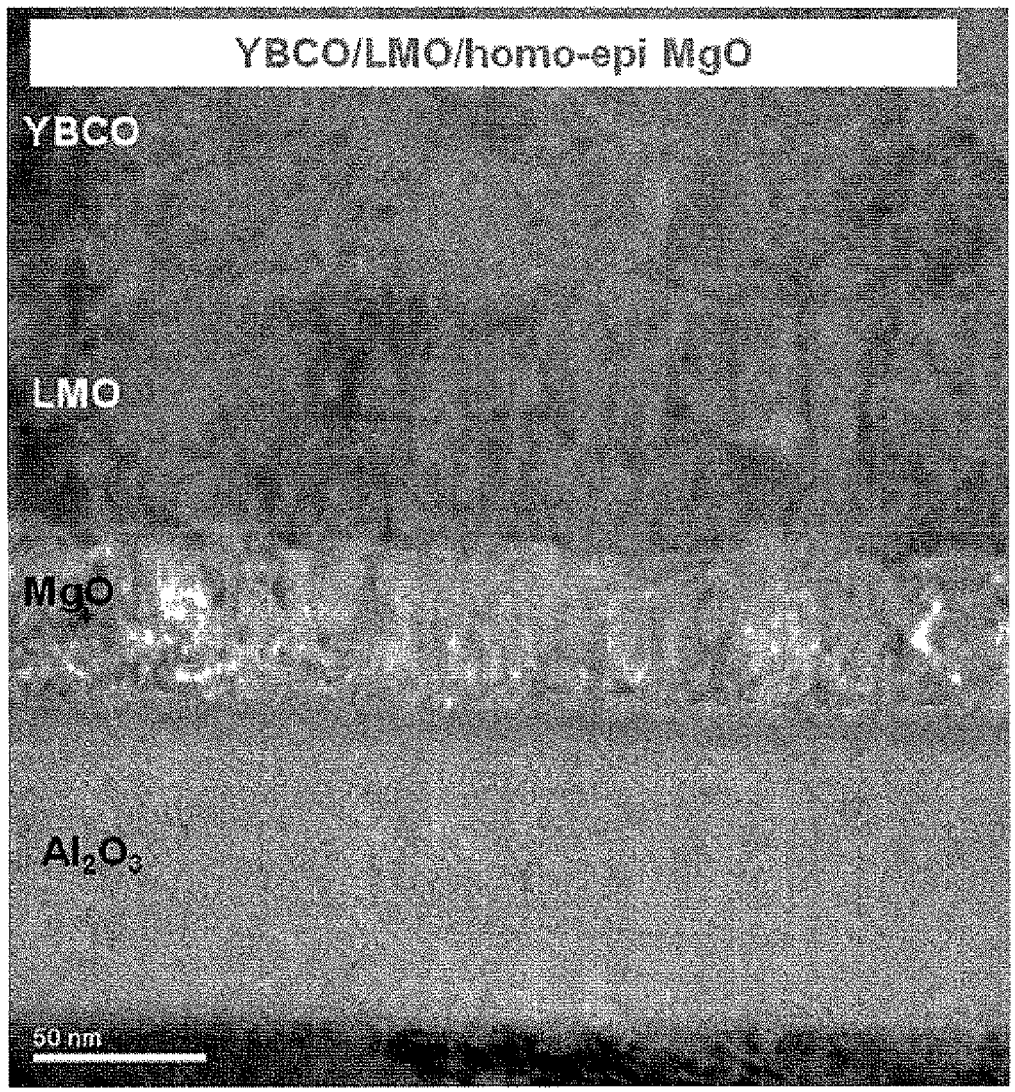
FIG. 9. Cross-sectional TEM image of a PLD-YBCO film deposited on a conventional (i.e., standard, non-phase-separated) LMO/homo-epi-MgO/IBAD-MgO template. The interfaces between YBCO and LMO and also between LMO and MgO are flat and clean, without any indication of interfacial reaction or extended defects into the YBCO layer.

FIGS. 8 and 9 show cross-sectional TEM images of PLD-YBCO films deposited on conventional (i.e., standard) LMO/IBAD-MgO and LMO/homo-epi-MgO/IBAD-MgO templates, respectively. The interfaces between YBCO and LMO and also between LMO and MgO are flat and clean, without any indication of interfacial reaction. A comparison of FIGS. 8 and 9 with the LMO:MgO(5 vol %)/IBAD-MgO architecture of FIG. 6 and LMO:MgO(50 vol %)/homo-epi-MgO/IBAD-MgO architecture of FIG. 7 reveals distinct microstructural properties. It is particularly noteworthy that, in contrast to the columnar structures evident in the phase-separated layers of the invention, no vertically-oriented, columnar nanostructures are evident on pure (i.e., non-phase-separated) LMO cap films deposited on either IBAD-MgO or homo-epi MgO templates.

Current Density ($J_c$) Measurements

Figure 11:
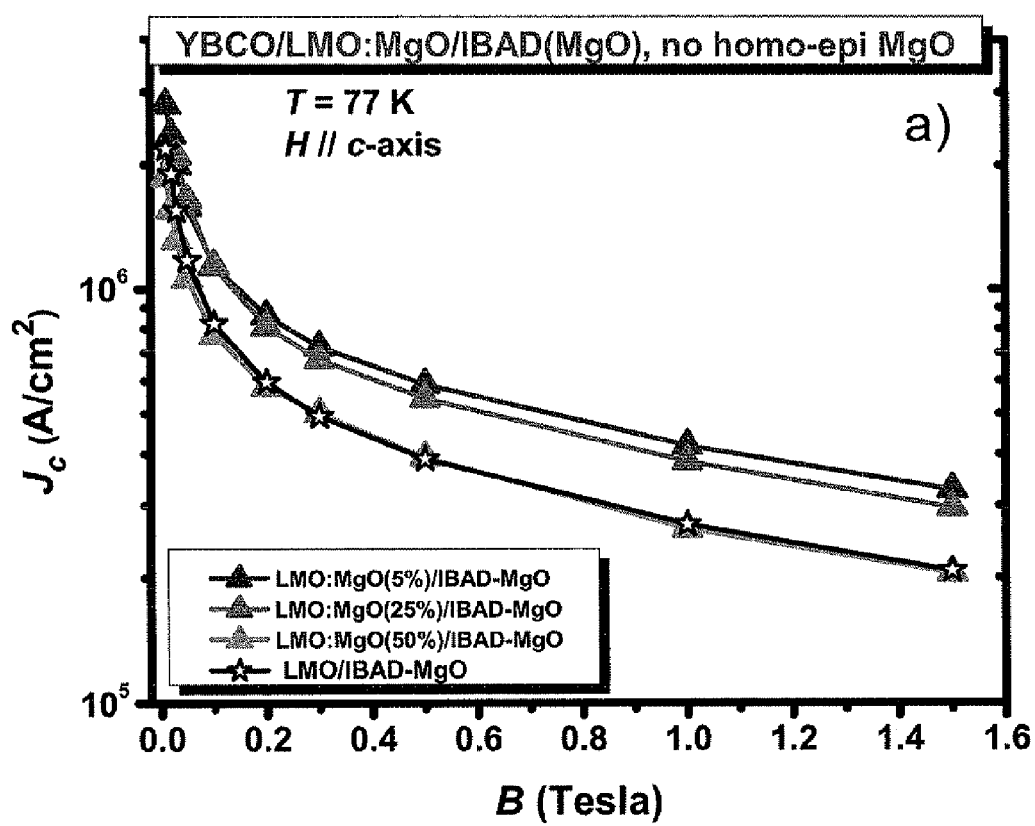
FIG. 11. A graph comparing magnetic field dependence of transport $J_c$ (77 K) for two 1 μm-thick YBCO films grown on LMO:MgO composite (solid symbols) and control LMO films (open symbols). Data is presented at 77 K with the field applied parallel and perpendicular to the c-axis.

FIG. 11 compares the 77K transport critical current densities as a function of applied magnetic field (B∥c-axis) for ~1 μm-thick YBCO films deposited on different MgO-containing (5, 25, and 50 vol %) LMO:MgO composite films, as well as on reference standard LMO templates. YBCO films on the modified cap layers demonstrate significantly improved $J_c$ compared to that obtained for the standard counterparts, despite the similar superconducting critical temperatures ($T_c$~88-89 K). In particular, the relative improvement becomes more significant with increase in the magnetic field strength, indicating enhanced high-density pinning, consistent with the cross-sectional TEM of FIG. 6. Specifically, at 1 Tesla applied field, over 40% enhancement in $J_c$ was found for cap layers modified with 5 vol % MgO. The self-field $J_c$ (77 K) of this film was also slightly higher, i.e., ~2.8×10$^6$ A/cm$^2$. However, $J_c$ performance decreases with further increase in the MgO concentration, falling at or below the performance level of YBCO on the standard architectures at an MgO content of 50 vol %. This behavior is consistent with the XRD observations, where an increase in misoriented grains was detected with higher MgO concentrations.

Figure 12:
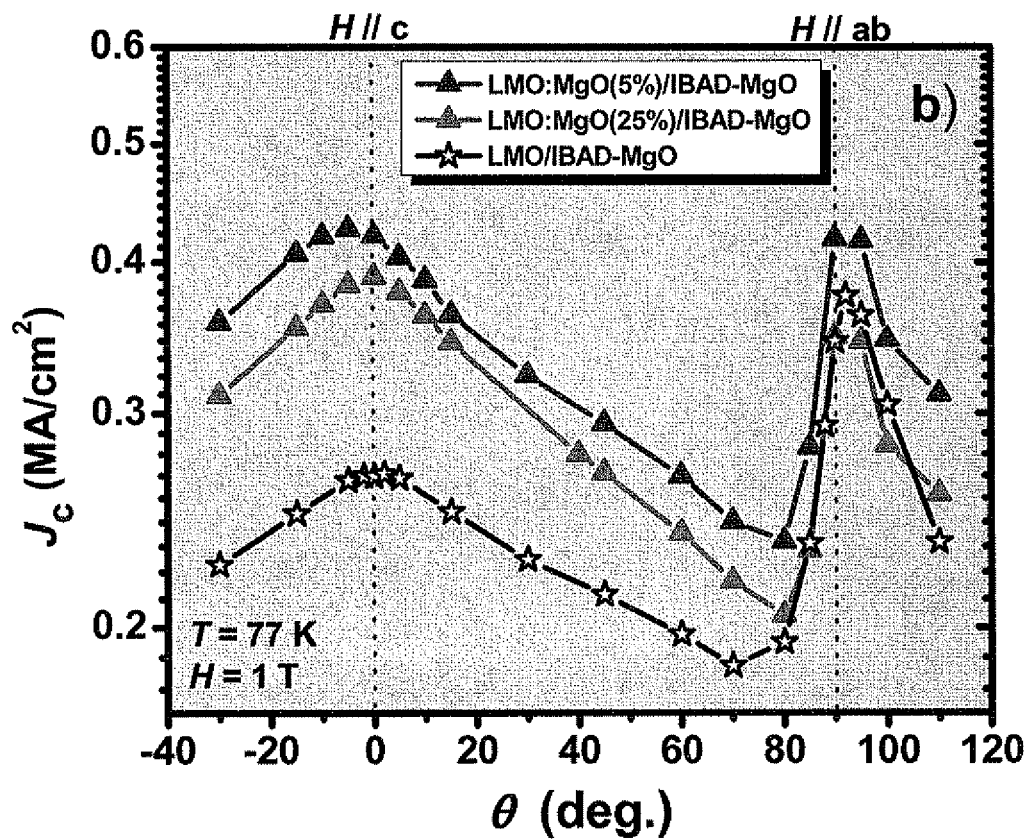
FIG. 12. A graph showing angular dependence of $J_c$ (77 K) at 1 T for a 1 μm-thick YBCO film on LMO:MgO composite buffer layer deposited directly (without homo-epitaxial MgO layer) on IBAD-MgO template. For comparison, data are also shown for typical YBCO/LMO/IBAD-MgO architecture.

FIG. 12 shows the angular dependence of $J_c$ at 77 K and 1 Tesla for the same samples shown in FIG. 11. The effect of LMO:MgO films on the angularly selective enhancement of $J_c$, in particular about the c-axis of the YBCO film, is clearly evident from the figure. The data presented in FIG. 12 also reveal significant improvement in $J_c$ over a wide range of orientations. In particular, these YBCO films show a much improved large peak about B∥c-axis (θ=0°), consistent with the field dependence data, and the presence of additional strong, uniaxial pinning defects approximately along this direction. The TEM analysis shown in FIG. 6 corroborates these observations with visual evidence of c-axis correlated defects within the YBCO matrix.

EXAMPLE 4

Deposition of a Phase-Separated LMO:Al$_2$O$_3$ Layer on a Homo-Epi-MgO/IBAD-MgO Substrate In-Situ Annealing of Substrate Prior to Deposition of LMO:Al$_2$O$_3$ Phase-Separated Layer As the MgO surface is known to be hygroscopic, an annealing process was performed on the substrate of the MgO surface prior to deposition of the phase-separated layer. The annealing process was conducted in a manner that removes surface-adsorbed water and hydrocarbons. Removal of these species ensures a chemically clean surface for the reproducible growth of subsequent LMO:$Al_2O_3$ composite layers. The annealing process included the following steps:

1. The annealing gas, in this case, a mixture of Ar, $H_2$(4%) and $O_2$, was introduced into the deposition chamber, and the total chamber pressure adjusted to $5 \times 10^{-3}$ Torr.

2. The temperature of the substrate was increased from room temperature (RT) to 750° C. at a rate of 140° C./min.

3. The substrate was in-situ annealed for 30-45 minutes at 750° C. in the presence of the annealing gas.

4. Following step 3, the pressure in the chamber was set to a sputtering pressure of $7 \times 10^{-3}$ Torr before the sputtering deposition step was started.

Radiofrequency (RF) Sputtering Process Used for Deposition of LMO:$Al_2O_3$ Phase-Separated Layer The RF sputtering system used consisted of a vacuum deposition chamber equipped with a halogen lamp heater assembly. The sputter cathode used was a two-inch in diameter commercial Kurt T. Lesker sputter source driven by rf or dc power supplies. The depositions took place in sputter-up configuration. The chamber was pumped down to $10^{-2}$ Torr by a mechanical pump, followed by a turbo pump that further reduced the base-pressure down to $10^{-5}$ Torr. The sputter or annealing gas was delivered into the chamber by MKS mass flow controllers. The pressure of the system was controlled by a manually-operated gate valve.

The sputter target was made from a mixture of stoichiometric LMO powder, prepared by solid state reaction, and commercially available $Al_2O_3$ powder, which was packed into a two-inch copper tray. The $Al_2O_3$ composition in the target was 25 vol %. Depositions were conducted in a Ar—$H_2$ (4%) and $O_2$ gas mixture and at a substrate temperature of 780° C. This was followed by post annealing in a tube furnace for 2 hours at 800° C. in order to further develop the phase segregation.

The following conditions were employed for the RF sputtering deposition of the LMO:$Al_2O_3$ phase-separated layer:

Base Pressure (Background pressure of the system): ~$2 \times 10^{-5}$ Torr.

Sputter Pressure: $7 \times 10^{-13}$ Torr

Sputter Temperature (Substrate Temperature): 750° C.

Sputter Time: 1 hr 30 min (for all substrates)

Sputter Power: 80 Watt

Sputter Gas: For all substrates, a mixture of $O_2$ and Ar—$H_2$ (4%) with a flow ratio of 1/5 respectively.

The above procedure resulted in a layer of phase-separated LMO:$Al_2O_3$ of 210 nm thickness.

After the above sputtering procedure was completed, the coated substrate was cooled as follows:

1) Gas flow into the chamber was stopped.

2) The temperature was then decreased to room temperature by turning off the power of the substrate heater and waiting for the heater assembly to cool down to room temperature. About two hours was required for the temperature to drop from 700° C. to 24° C. During the cooling procedure, the deposition chamber was maintained under a reduced pressure of about $2 \times 10^{-5}$ Torr.

3) The coated substrates were removed from the deposition chamber at room temperature.

Post-Annealing of the LMO:$Al_2O_3$-Coated Substrate After the Sputtering Deposition Procedure Post-annealing was performed in a pre-heated tube furnace under a flowing Ar atmosphere at 1 atm pressure. The annealing temperature was 800° C. Post-annealing gas was introduced before the samples were inserted into the tube in order to purge out any residual gas. The tube was purged for about 5-10 minutes before introducing the samples therein. Samples were then inserted into the pre-heated furnace with a rod assembly. Annealing time was about two hours. After the post-annealing procedure, the samples were cooled to room temperature by pulling the rod assembly out of the hot zone, during which time the gas flow was maintained at 1 Atm. The cooling process proceeded under gas flow for about 40-50 minutes. The samples were then removed from the furnace.

EXAMPLE 5

Analysis of the Phase-Separated Layer in the LMO:$Al_2O_3$-Coated Substrate

X-Ray Diffraction Measurements

Figure 13:
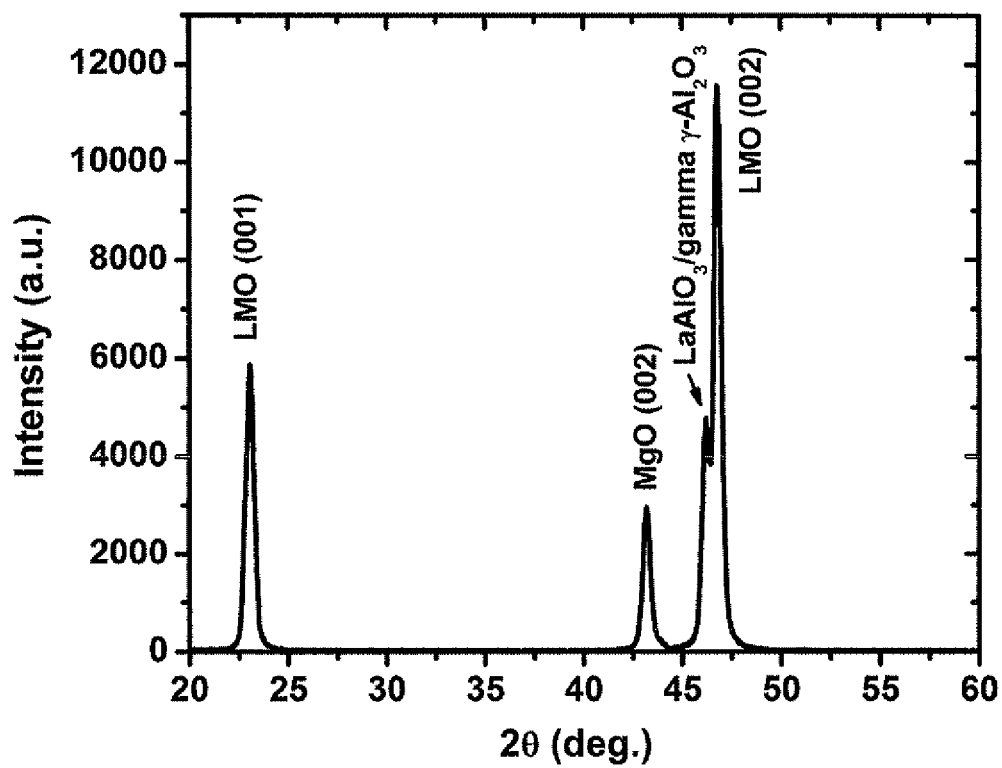
FIG. 13. X-ray θ-2θ diffraction pattern for a LMO:$Al_2O_3$ (25 vol %) composite film deposited directly on a LMO/Homo-epi-MgO/IBAD-MgO template.

FIG. 13 shows an X-ray $\theta$-$2\theta$ diffraction pattern for a LMO:$Al_2O_3$ (25 vol %) composite film deposited directly on a LMO/Homo-epi-MgO/IBAD-MgO template. The diffraction pattern shows the separation of LMO, $LaAlO_3$ (LAO), and gamma-$Al_2O_3$ phases. The phase-separated films also display a preferred c-axis orientation. This demonstrates a possibility of phase separating more than two phases with self-assembly via $LaMnO_3$, $LaAlO_3$, and gamma-$Al_2O_3$. $LaAlO_3$ forms due to the reaction of $Al_2O_3$ with $LaMnO_3$.

While there have been shown and described what are at present considered the preferred embodiments of the invention, it will be obvious to those skilled in the art that various changes and modifications can be prepared therein without departing from the scope of the inventions defined by the appended claims. For example, in addition to high temperature superconductor layers, other active semiconductor layers could be deposited on these phase-separated layers.

What is claimed is:

1. A method for producing a phase-separated layer useful as a flux pinning substrate for a superconducting film, the method comprising providing a primary substrate containing an ordered surface layer thereon, and sputtering a target comprised of at least a first and a second material to achieve a phase-separated layer, comprised of at least two phase-separated components, deposited epitaxially on said primary substrate, wherein said sputtering employs a temperature of at least 500° C. and an operating pressure of at least 0.1 mTorr and no more than 50 mTorr, and said phase-separated layer has an exposed phase-separated surface.

2. The method of claim 1, wherein the sputtering is achieved by magnetron sputtering.

3. The method of claim 2, wherein the magnetron sputtering is radiofrequency magnetron sputtering.

4. The method of claim 2, wherein the magnetron sputtering is reactive DC magnetron sputtering.

5. The method of claim 1, wherein said first and second materials are independently selected from the group consisting of a metal oxide, metal nitride, metal carbide, metal sulfide, and combinations thereof.

6. The method of claim 1, wherein at least one of said first and second materials is a metal oxide material selected from the group consisting of a spinel oxide, perovskite oxide, alkali metal oxide, alkaline earth metal oxide, transition metal oxide, main group metal oxide, and rare earth oxide.

7. The method of claim 1, wherein at least one of said first and second materials is a perovskite oxide of the formula M'M"$O_3$, wherein M' and M" are independently monovalent, divalent, trivalent, tetravalent, or pentavalent elements, provided that the sum of oxidation states of M' and M" add to +6 to charge balance with oxide atoms.

8. The method of claim 7, wherein M' and M" are both trivalent elements.

9. The method of claim 8, wherein the formula M'M"$O_3$ is according to the subformula (RE)M"$O_3$, wherein RE represents one or a combination of rare earth metals and M" is a trivalent metal ion.

10. The method of claim 8, wherein the formula M'M"$O_3$ is according to the subformula LaM"$O_3$, wherein M" is a trivalent metal ion.

11. The method of claim 8, wherein the formula M'M"$O_3$ is according to the subformula M'MnO$_3$, wherein M' is a trivalent metal ion.

12. The method of claim 8, wherein the formula M'M"$O_3$ is according to the subformula (RE)MnO$_3$, wherein RE represents one or a combination of rare earth metals.

13. The method of claim 8, wherein the formula M'M"$O_3$ is LaMnO$_3$.

14. The method of claim 1, wherein one of said first and second materials is a perovskite oxide material and the other of said first and second materials is selected from alkali metal oxide, alkaline earth oxide, spinel oxide, transition metal oxide, main group metal oxide, or rare earth metal oxide.

15. The method of claim 1, wherein one of said first and second materials is a perovskite oxide material and the other of said first and second materials is an alkali metal oxide or alkaline earth metal oxide.

16. The method of claim 1, wherein one of said first and second materials is a perovskite oxide material and the other of said first and second materials is a main group metal oxide.

17. The method of claim 1, wherein the separated phases of the phase-separated layer are in an ordered arrangement.

18. The method of claim 1, wherein at least one of the separated phases of the phase-separated layer is in the form of columnar structures oriented substantially perpendicular to the ordered surface layer of the primary substrate.

19. The method of claim 1, wherein the ordered surface layer of the primary substrate is an crystalline or polycrystalline metal-containing layer.

20. The method of claim 1, wherein the ordered surface layer of the primary substrate is an crystalline or polycrystalline metal oxide layer.

21. The method of claim 1, wherein the ordered surface layer of the primary substrate is a crystalline or polycrystalline alkaline earth metal oxide layer.

22. The method of claim 1, wherein said temperature is no more than 650° C.

23. The method of claim 1, wherein said operating pressure is no more than 20 mTorr.

24. The method of claim 1, wherein said sputtering results in a reaction between said at least first and second materials to form another phase-separated component.

25. The method of claim 24, wherein said sputtering results in a phase-separated layer comprised of at least three phase-separated components.

26. A method for producing a superconducting tape containing pinning defects therein, the method comprising:
(i) providing a primary substrate containing an ordered surface layer thereon, and sputtering a target comprised of at least a first and a second material to achieve a phase-separated layer, comprised of at least two phase-separated components, deposited epitaxially on said primary substrate, wherein said sputtering employs a temperature of at least 500° C. and an operating pressure of at least 0.1 mTorr and no more than 50 mTorr, and said phase-separated layer has an exposed phase-separated surface; and
(ii) depositing a superconductor film on said exposed phase-separated surface.

27. The method of claim 26, wherein the superconducting film is a high temperature superconducting film.

28. The method of claim 26, wherein the superconducting film has a metal-barium-copper-oxide composition.

29. The method of claim 26, wherein the superconducting film has a composition of the formula (RE)Ba$_2$Cu$_3$O$_7$, wherein RE is a rare earth or transition metal element.

30. The method of claim 26, wherein the superconducting film has a yttrium-barium-copper-oxide composition.

31. The method of claim 26, wherein the superconducting film has the composition YBa$_2$Cu$_3$O$_7$.

32. The method of claim 26, wherein the superconducting film is deposited by a physical vapor deposition technique.

33. The method of claim 32, wherein the physical vapor deposition technique is a pulsed laser deposition technique.

34. The method of claim 26, wherein the superconducting film is deposited by a chemical vapor deposition technique.

* * * * *